United States Patent
Hahn et al.

(10) Patent No.: US 10,056,152 B2
(45) Date of Patent: Aug. 21, 2018

(54) METHODS OF READING DATA IN NONVOLATILE MEMORY DEVICES AND NONVOLATILE MEMORY DEVICES

(71) Applicant: Samsung Electronics Co., Ltd., Suwon-si (KR)

(72) Inventors: Wook-Ghee Hahn, Hwaseong-si (KR); Ji-Sang Lee, Iksan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/493,326

(22) Filed: Apr. 21, 2017

(65) Prior Publication Data

US 2018/0090216 A1  Mar. 29, 2018

(30) Foreign Application Priority Data

Sep. 23, 2016 (KR) .................. 10-2016-0121862

(51) Int. Cl.
| | |
|---|---|
| *G11C 11/34* | (2006.01) |
| *G11C 16/34* | (2006.01) |
| *G11C 16/26* | (2006.01) |
| *G11C 16/10* | (2006.01) |
| *G11C 16/16* | (2006.01) |

(52) U.S. Cl.
CPC .......... *G11C 16/3427* (2013.01); *G11C 16/10* (2013.01); *G11C 16/16* (2013.01); *G11C 16/26* (2013.01); *G11C 16/3459* (2013.01)

(58) Field of Classification Search
CPC ..... G11C 16/3427; G11C 16/26; G11C 16/10; G11C 16/16; G11C 16/3459
USPC ........................................ 365/185.02, 185.03
See application file for complete search history.

(56) References Cited

U.S. PATENT DOCUMENTS

| | | | |
|---|---|---|---|
| 7,542,350 B2 | 6/2009 | Park et al. | |
| 8,422,291 B2 | 4/2013 | Kim et al. | |
| 8,665,643 B2 | 3/2014 | Kim et al. | |
| 8,717,822 B2 * | 5/2014 | Lee .................... | G11C 11/5642 365/185.17 |
| 8,811,094 B2 | 8/2014 | Lee et al. | |
| 8,817,545 B2 | 8/2014 | Seol et al. | |

(Continued)

FOREIGN PATENT DOCUMENTS

| | | |
|---|---|---|
| KR | 10-2012-0056422 A | 6/2012 |
| KR | 10-2013-0049331 A | 5/2013 |

(Continued)

*Primary Examiner* — Viet Q Nguyen
(74) *Attorney, Agent, or Firm* — Muir Patent Law, PLLC

(57) ABSTRACT

In a method of reading data in a nonvolatile memory device including a plurality of memory cells arranged at intersections of a plurality of word-lines and a plurality of bit-lines, a read request on a first word-line of the plurality of word-lines is received, a read operation is performed on a second word-line adjacent to the first word-line and a read operation is performed on the first word-line based on data read from memory cells of the second word-line. The read operation on the first word-line is performed by adjusting a level of recover read voltage applied to the first word-line during the read operation of the first word-line based on at least one of a program state of the data read from memory cells of the second word-line and an operating parameter of the nonvolatile memory device.

16 Claims, 19 Drawing Sheets

(56) References Cited

U.S. PATENT DOCUMENTS

| | | | |
|---|---|---|---|
| 9,021,338 B2 | 4/2015 | Joo et al. | |
| 2011/0289388 A1* | 11/2011 | Nelson | G11C 11/5642 |
| | | | 714/773 |
| 2012/0230104 A1* | 9/2012 | Kim | G11C 11/5642 |
| | | | 365/185.03 |
| 2016/0004437 A1 | 1/2016 | Kim et al. | |
| 2016/0033976 A1 | 2/2016 | Jung et al. | |
| 2016/0118129 A1 | 4/2016 | Muchherla et al. | |
| 2016/0124805 A1 | 5/2016 | Lee | |
| 2016/0217032 A1* | 7/2016 | Yum | G06F 11/1048 |

FOREIGN PATENT DOCUMENTS

| | | |
|---|---|---|
| KR | 10-2014-0065244 A | 5/2014 |
| KR | 10-2016-00005264 A | 1/2016 |
| KR | 10-2016-0014863 A | 2/2016 |

\* cited by examiner

| CLE | COMMAND LATCH ENABLE |
| ALE | ADDRESS LATCH ENABLE |
| nCE | CHIP ENABLE |
| nRE | READ ENABLE |
| nWE | WRITE ENABLE |

READ DATA FROM MEMORY CELLS OF THE FIRST
WORD-LINE USING ONE RECOVER READ VOLTAGE
WHILE ADJUSTING DEVELOPING TIME OF SENSING —S231
NODE DEPENDING ON AT LEAST ONE OF PROGRAM
STATE AND OPERATING PARAMETER

METHODS OF READING DATA IN NONVOLATILE MEMORY DEVICES AND NONVOLATILE MEMORY DEVICES

CROSS-REFERENCE TO RELATED APPLICATION

This US application claims priority under 35 USC § 119 to Korean Patent Application No. 10-2016-0121862, filed on Sep. 23, 2016, in the Korean Intellectual Property Office (KIPO), the disclosure of which is incorporated in its entirety by reference herein.

BACKGROUND

1. Technical Field

Exemplary embodiments relate generally to semiconductor memory devices, and more particularly to methods of reading data in nonvolatile memory devices and nonvolatile memory devices.

2. Discussion of the Related Art

Semiconductor memory devices may be typically classified into volatile semiconductor memory devices and nonvolatile semiconductor memory devices. Volatile semiconductor memory devices may perform read and write operations at a high speed, while contents stored therein may be lost when the devices are powered-off. Nonvolatile semiconductor memory devices may retain contents stored therein even when powered-off. For this reason, nonvolatile semiconductor memory devices may be used to store contents to be retained regardless of whether the devices are powered on or off.

Nonvolatile semiconductor memory devices may include a mask read-only memory (MROM), a programmable ROM (PROM), an erasable programmable ROM (EPROM), an electrically erasable programmable ROM (EEPROM), etc.

A flash memory device may be a typical nonvolatile memory device. A flash memory device may be widely used as the voice and image storing media of electronic apparatuses such as a computer, a cellular phone, a PDA, a digital camera, a camcorder, a voice recorder, an MP3 player, a handheld PC, a game machine, a facsimile, a scanner, a printer, etc.

In a read operation for a flash memory device, a threshold voltage distribution of memory cells connected to a particular word-line may shift by coupling from an adjacent word-line of the particular word-line. Therefore, it is desired to reduce the adjacent word-line coupling in a read operation of the flash memory device.

SUMMARY

Some exemplary embodiments are directed to provide a method of reading data in a nonvolatile memory device, capable of enhancing performance.

Some exemplary embodiments are directed to provide a nonvolatile memory device, capable of enhancing performance.

According to exemplary embodiments, in a method of reading data in a nonvolatile memory device including a plurality of memory cells arranged at intersections of a plurality of word-lines and a plurality of bit-lines, a read request on a first word-line of the plurality of word-lines is received, a read operation is performed on a second word-line adjacent to the first word-line and a read operation is performed on the first word-line based on data read from memory cells of the second word-line. The read operation on the first word-line is performed by adjusting a level of recover read voltage applied to the first word-line during the read operation of the first word-line based on at least one of a program state of the data read from memory cells of the second word-line and an operating parameter of the nonvolatile memory device.

According to exemplary embodiments, in a method of reading data in a nonvolatile memory device including a plurality of memory cells arranged at intersections of a plurality of word-lines and a plurality of bit-lines, a read request on a first word-line of the plurality of word-lines is received, a read operation is performed on a second word-line adjacent to the first word-line and a read operation is performed on the first word-line based on data read from memory cells of the second word-line. The read operation on the first word-line is performed by latching a voltage of each sensing node corresponding to each of the bit-lines at least two times as first data and second data based on at least one of a program state of the data read from memory cells of the second word-line and an operating parameter of the nonvolatile memory device while maintaining a level of recover read voltage applied to the first word-line.

According to exemplary embodiments, a nonvolatile memory device includes a memory cell array, a voltage generator, an address decoder, a page buffer circuit and a control circuit. The memory cell array includes a plurality of memory cells arranged at intersections of a plurality of word-lines and a plurality of bit-lines. The voltage generator generates word-line voltages in response to control signals. The address decoder applies the word-line voltages to the memory cell array in response to an address signal. The page buffer circuit is coupled to the memory cell array through the bit-lines. The control circuit generates the control signals to control the voltage generator and controls the page buffer circuit, based on a command and an address received from outside the nonvolatile memory device, and configured to generate the address signal based on the address. When the control circuit receives a read request on a first word-line of the plurality of word-lines, the control circuit performs a read operation on a second word-line adjacent of the first word-line, performs a read operation on the first word-line based on data read from memory cells of the second word-line by adjusting a level of recover read voltage applied to the first word-line during the read operation of the first word-line based on at least one of a program state of the data read from memory cells of the second word-line and an operating parameter of the nonvolatile memory device.

According to exemplary embodiments, a method of reading data in a nonvolatile memory device is provided. The nonvolatile memory device includes a plurality of memory cells arranged at intersections of a plurality of word-lines and a plurality of bit-lines, each of the memory cells stored m-bit data and programmed to have one of an erase state and first through $2^m-1$ program states, m being a natural number equal to or greater than 1. The method of reading data includes receiving a read request on a first word-line of the plurality of word-lines, performing a read operation on a second word-line adjacent to the first word-line, and performing a read operation on the first word-line based on data read from memory cells of the second word-line. Data of the memory cells of the second word-line include one of a first set of program states including a lowermost program state of the $2^m-1$ program states and a second set of program states including an uppermost program state of the $2^m-1$ program states. The performing the read operation on the first word-line comprises selecting a level of a recover read voltage to apply to the first word-line during the read operation for the first word-line based on the first and second sets of program states of memory cells of the second word-line.

Accordingly, according to exemplary embodiments, data are read from memory cells experiencing word-line coupling from adjacent word-lines by adjusting the level of the recover read voltage applied to a selected word-line or adjusting develop time of the sensing node based on program state of the data read from at least one adjacent word-line and the operating parameter thereby to enhance performance.

BRIEF DESCRIPTION OF THE DRAWINGS

Illustrative, non-limiting exemplary embodiments will be more clearly understood from the following detailed description in conjunction with the accompanying drawings.

FIG. 17 illustrates that the read operation on the first word-line is performed in the method of FIG. 16 according to exemplary embodiments.

DETAILED DESCRIPTION

Various exemplary embodiments will be described more fully hereinafter with reference to the accompanying drawings, in which some exemplary embodiments are shown.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items. Expressions such as that, although the terms first, second, third etc. may be used herein to describe various elements, these elements should elements of the list.

Figures 1, 2:
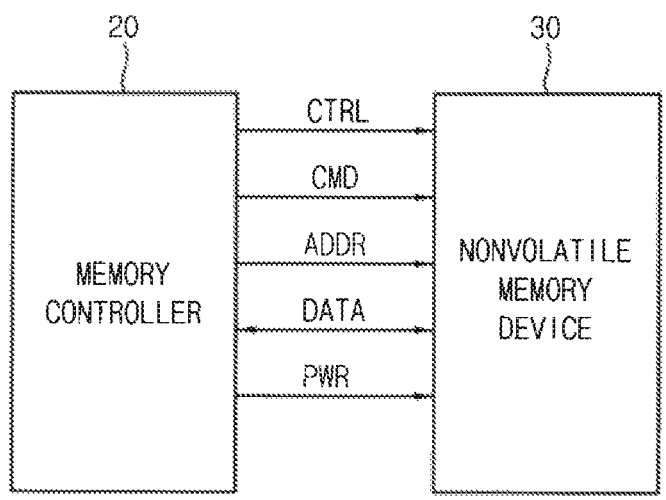
FIG. 1 is a block diagram illustrating a memory system according to exemplary embodiments.
FIG. 2 is a table illustrating control signals in the memory system of FIG. 1.

FIG. 1 is a block diagram illustrating a memory system according to exemplary embodiments.

Referring to FIG. 1, a memory system (or, a nonvolatile memory system) 10 may include a memory controller 20 and at least one nonvolatile memory device 30.

The memory system 10 may include data storage media based flash memory such as a memory card, a universal serial bus (USB) memory and solid state drive (SSD).

The nonvolatile memory device 30 may perform a read operation, an erase operation, and a program operation or a write operation under control of the memory controller 20. The nonvolatile memory device 30 receives a command CMD, an address ADDR and data DATA through input/output lines from the memory controller 20 for performing such operations. In addition, the nonvolatile memory device 30 receives a control signal CTRL through a control line from the memory controller 20. In addition, the nonvolatile memory device 30 receives a power PWR through a power line from the memory controller 20.

FIG. 2 is a table illustrating control signals in the memory system of FIG. 1.

Referring to FIGS. 1 and 2, the control signal CTRL, which the memory controller 20 applies to the nonvolatile memory device 30, may include, a command latch enable signal CLE, an address latch enable signal ALE, a chip enable signal nCE, a read enable signal nRE, and a write enable signal nWE.

The memory controller 20 may transmit the command latch enable signal CLE to the nonvolatile memory device 30. For example, the memory controller 20 may transmit the command latch enable signal CLE to the nonvolatile memory device 30 via a separately assigned control pin. The command latch enable signal CLE may be a signal indicating that information transferred via the input/output lines is a command.

The memory controller 20 may transmit the address latch enable signal ALE to the nonvolatile memory device 30. The memory controller 20 may transmit the address latch enable signal ALE to the nonvolatile memory device 30 via a separately assigned control pin. The address latch enable signal ALE may be a signal indicating that information transferred via the input/output lines is an address.

The memory controller 20 may transmit the chip enable signal nCE to the nonvolatile memory device 30. The memory controller 20 may transmit the chip enable signal nCE to the nonvolatile memory device 30 via a separately assigned control pin. The chip enable signal nCE may indicate a memory chip selected from among a plurality of memory chips when the nonvolatile memory device includes the plurality of memory chips. For example, the chip enable signal nCE may include one or more chip enable signals nCEs.

The memory controller 20 may transmit the read enable signal nRE to the nonvolatile memory device 30. The memory controller 20 may transmit the read enable signal nRE to the nonvolatile memory device 30 via a separately assigned control pin. The nonvolatile memory device 30 may transmit read data to the memory controller 20 based on the read enable signal nRE.

The memory controller 20 may transmit the write enable signal nWE to the nonvolatile memory device 30. The memory controller 20 may transmit the write enable signal nWE to the nonvolatile memory device 30 via a separately assigned control pin. When the write enable signal nWE is activated, the nonvolatile memory device 30 may store data input signals provided from the memory controller 20 to the nonvolatile memory device 30.

Figure 3:
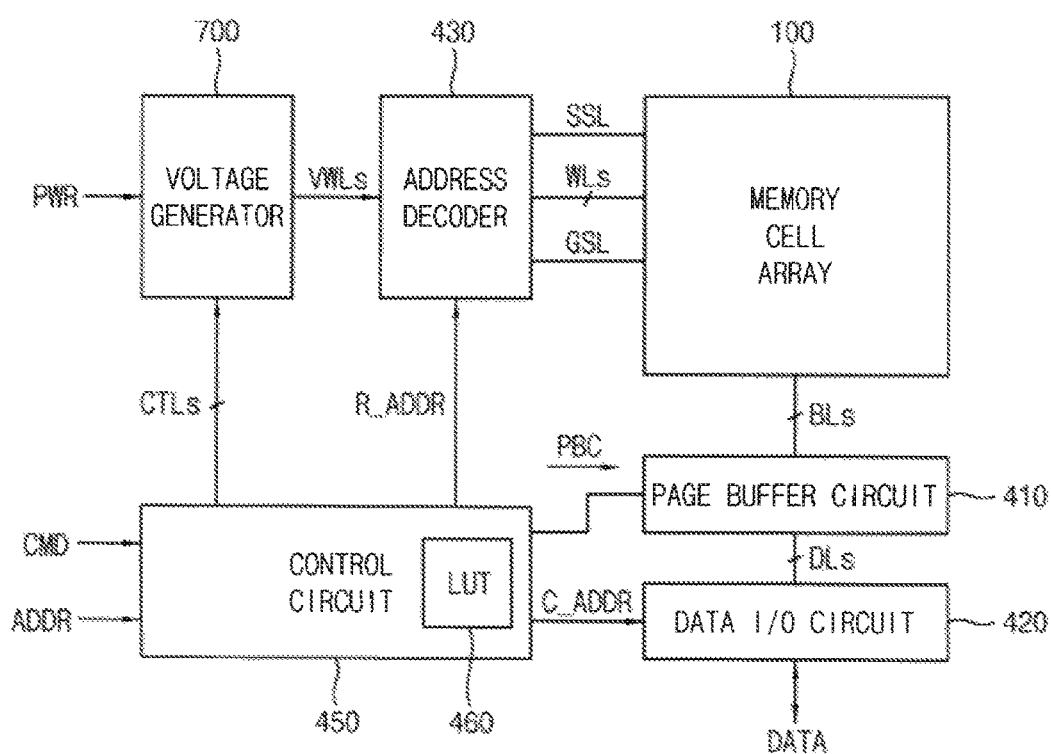
FIG. 3 is a block diagram illustrating the nonvolatile memory device in the memory system of FIG. 1 according to exemplary embodiments.

FIG. 3 is a block diagram illustrating the nonvolatile memory device in the memory system of FIG. 1 according to exemplary embodiments.

Referring to FIG. 3, the nonvolatile memory device 30 includes a memory cell array 100, an address decoder 430, a page buffer circuit 410, a data input/output circuit 420, a control circuit 450 and a voltage generator 700. The control circuit 500 may include a look-up table 460.

The memory cell array 100 may be coupled to the address decoder 430 through a string selection line SSL, a plurality of word-lines WLs, and a ground selection line GSL. In addition, the memory cell array 100 may be coupled to the page buffer circuit 410 through a plurality of bit-lines BLs.

The memory cell array 100 may include a plurality of memory cells coupled to the plurality of word-lines WLs and the plurality of bit-lines BLs.

In some exemplary embodiments, the memory cell array 100 may be a three-dimensional memory cell array, which is formed on a substrate in a three-dimensional structure (or a vertical structure). In this case, the memory cell array 100 may include vertical cell strings that are vertically oriented such that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648.

In other exemplary embodiments, the memory cell array 100 may be a two-dimensional memory cell array, which is formed on a substrate in a two-dimensional structure (or a horizontal structure).

Referring still to FIG. 3, the address decoder 430 may select at least one of a plurality of memory blocks of the memory cell array 100 in response to an address ADDR from the memory controller 20. For example, the address decoder 430 may select at least one of a plurality of word lines in the selected one or more memory blocks. The address decoder 430 may transfer a voltage (e.g., a word-line voltage) generated from the voltage generator 700 to a selected word line. At a program operation, the address decoder 430 may transfer a program voltage or a verification voltage to a selected word line and a pass voltage to an unselected word line. At a read operation, the address decoder 430 may transfer a selection read voltage to a selected word line and a non-selection read voltage (or, pass voltage) to an unselected word line.

The page buffer circuit 410 may operate as a write driver at a program operation and a sense amplifier at a read operation. At a program operation, the page buffer circuit 410 may provide a bit line of the memory cell array 100 with a bit line voltage corresponding to data to be programmed. At a read or verification read operation, the page buffer circuit 410 may sense data stored in a selected memory cell via a bit line. The page buffer circuit 410 may include a plurality of page buffers PB1 to PBn each connected with one bit line or two bit lines.

The control circuit 450 may generate a plurality of control signals CTLs and a page buffer control signal PBC based on the command signal CMD. The control circuit 450 may also generate a row address R_ADDR and a column address C_ADDR based on the address signal ADDR. A detailed description for the control circuit 450 will be described later.

In example embodiments, the nonvolatile memory device 30 may further include a voltage generator (not shown) for supplying a variable voltage to a selected bit-line of the memory cell array 100 through the page buffer circuit 410. In other example embodiments, the page buffer circuit 410 may include the voltage generator (not shown) applying a variable voltage to a selected bit-line of the memory cell array 100.

Figure 4:
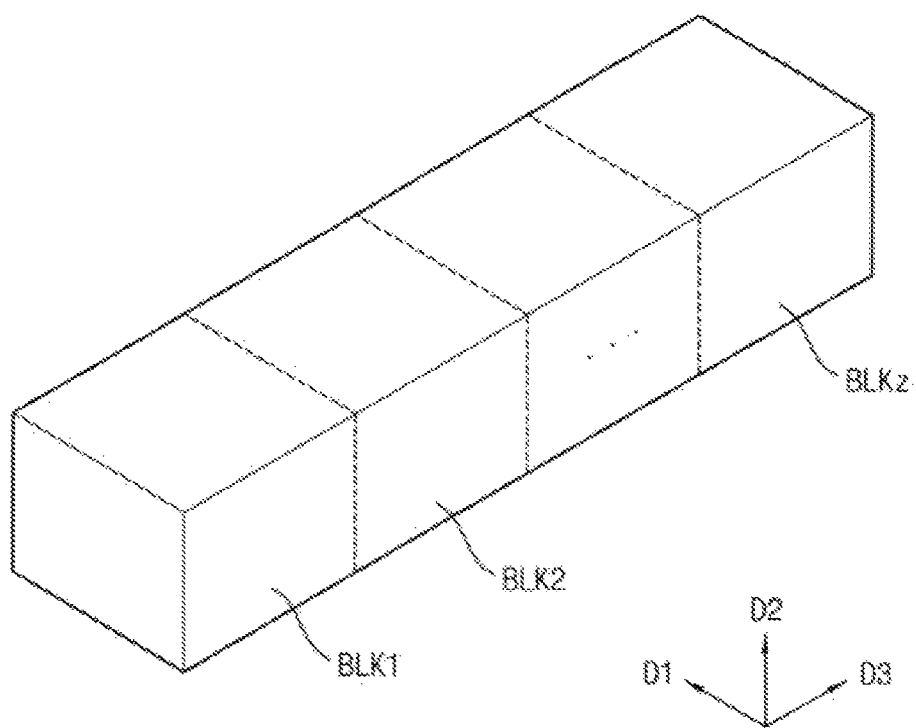
FIG. 4 is a block diagram illustrating the memory cell array in FIG. 3 according to exemplary embodiments.

FIG. 4 is a block diagram illustrating the memory cell array in FIG. 3 according to exemplary embodiments.

Referring to FIG. 4, the memory cell array 100 may include a plurality of memory blocks BLK1 to BLKz. In an embodiment, the memory blocks BLK1 to BLKz are selected by the address decoder 430 in FIG. 3. For example, the address decoder 430 may select a particular memory block BLK corresponding to a block address among the memory blocks BLK1 to BLKz.

Figure 5:
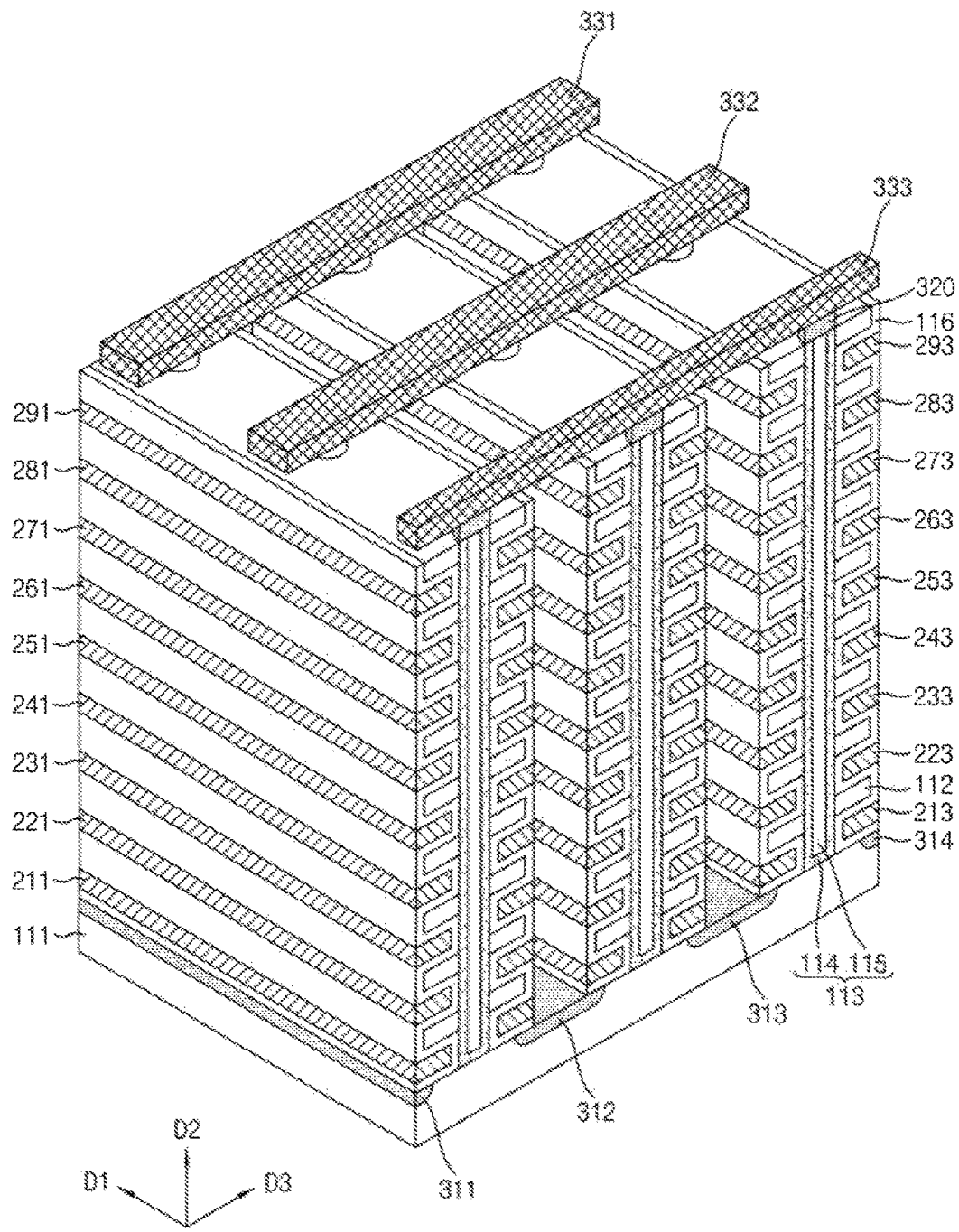
FIG. 5 is a perspective view illustrating one of the memory blocks of FIG. 4 according to exemplary embodiments.

FIG. 5 is a perspective view illustrating one of the memory blocks of FIG. 4 according to exemplary embodiments.

Figure 8:
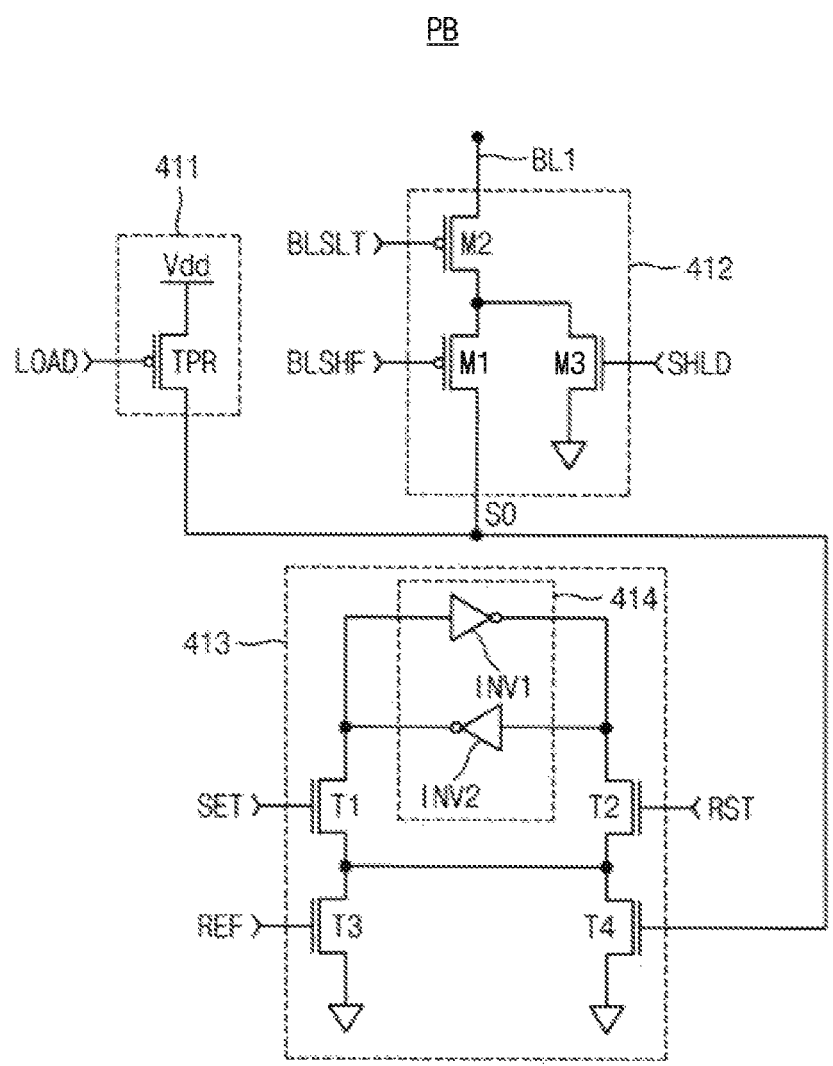
FIG. 8 is a circuit diagram illustrating one of page buffers in the page buffer circuit in the nonvolatile memory device of FIG. 3 according to exemplary embodiments.

Referring to FIG. 8, the memory block BLKi includes cell strings which are formed on a substrate in a three-dimensional structure (or a vertical structure). The memory block BLKi includes structures extending along the first to third directions D1~D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In an embodiment, the substrate 111 has a p-type well (or a p-type pocket well). However, the conductive type of the substrate 111 is not limited to the p-type.

A plurality of doping regions 311 to 314 extending along the first direction D1 are provided in/on the substrate 111. For example, the plurality of doping regions 311 to 314 may have a second type (e.g., a second conductive type) different from the first type of the substrate 111. In an embodiment, the first to fourth doping regions 311 to 314 have an n-type. However, the conductive type of the first to fourth doping regions 311 to 314 is not limited to the n-type.

A plurality of insulation materials 112 extending along the first direction D1 are sequentially provided along the second direction D2 on a region of the substrate 111 between the first and second doping regions 311 and 312. For example, the plurality of insulation materials 112 are provided along the second direction D2, being spaced by a specific distance. Exemplarily, the insulation materials 112 may include an insulation material such as an oxide layer.

A plurality of pillars 113 penetrating the insulation materials along the second direction D2 are sequentially disposed along the first direction D1 on a region of the substrate 111 between the first and second doping regions 311 and 312. For example, the plurality of pillars 113 penetrate the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In an embodiment, the channel layer 114 of each pillar 113 includes a p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. For example, the inner material 115 of each pillar 113 may include an air gap.

An insulation layer 116 is provided along the exposed surfaces of the insulation materials 112, the pillars 113, and the substrate 111, on a region between the first and second doping regions 311 and 312. Exemplarily, the insulation layer 116 provided on the exposed surface in the second direction D2 of the last insulation material 112 may be removed.

A plurality of first conductive materials 211 to 291 are provided on the exposed surface of the insulation layer 116, in a region between the first and second doping regions 311 and 312. For example, the first conductive material 211 extending along the first direction D1 is provided between the insulation material 112 adjacent to the substrate 111 and the substrate 111.

In more detail, the first conductive material 211 extending along the first direction D1 is provided between the insulation layer 116 at the bottom of the insulation material 112 adjacent to the substrate 111 and the substrate 111.

A first conductive material extending along the third direction D3 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may include a metal material. The first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of conductive materials 213 to 293 extending along the third direction D3.

In a region between the third and fourth doping regions 313 and 314, the same structures as those on the first and second doping regions 311 and 312 may be provided. In the region between the third and fourth doping regions 313 and 314, provided are a plurality of insulation materials 112 extending along the third direction D3, a plurality of pillars 113 disposed sequentially along the third direction D3 and penetrating the plurality of insulation materials 112 along the second direction D2, an insulation layer 116 provided on the exposed surfaces of the plurality of insulation materials 112 and the plurality of pillars 113, and a plurality of first conductive materials 213 to 293 extending along the third direction D3.

Drains 320 are provided on the plurality of pillars 113, respectively. The drains 320 may include silicon materials doped with a second type. For example, the drains 320 may include silicon materials doped with an n-type. In an embodiment, the drains 320 include n-type silicon materials. However, the drains 320 are not limited to the n-type silicon materials.

On the drains, the second conductive materials 331 to 333 extending along the third direction D3 are provided. The second conductive materials 331 to 333 are disposed along the first direction D1, being spaced by a specific distance. The second conductive materials 331 to 333 are respectively connected to the drains 320 in a corresponding region. The drains 320 and the second conductive material 333 extending along the third direction D3 may be connected through each contact plug. The second conductive materials 331 to 333 may include metal materials. The second conductive materials 331 to 333 may include conductive materials such as a polysilicon.

In example embodiments, each of the first conductive materials 211 to 291 may form a word-line or a selection line SSL/GSL. The first conductive materials 221 to 281 may be used as word-lines, and first conductive materials formed at the same layer may be interconnected. The memory block BLKi may be selected when the first conductive materials 211 to 291 all are selected. On the other hand, a sub-block may be selected by selecting a part of the first conductive materials 211 to 291.

The number of layers at which first conductive materials 211 to 291 are formed may not be limited to this disclosure. It is well understood that the number of layers at which the first conductive materials 211 to 291 are formed is changed according to a process technique and a control technique.

In example embodiments, each of the second conductive materials 331 to 333 may form a bit-line and each of the doping regions 311 to 314 may form a common source line of the cell strings.

Figure 6:
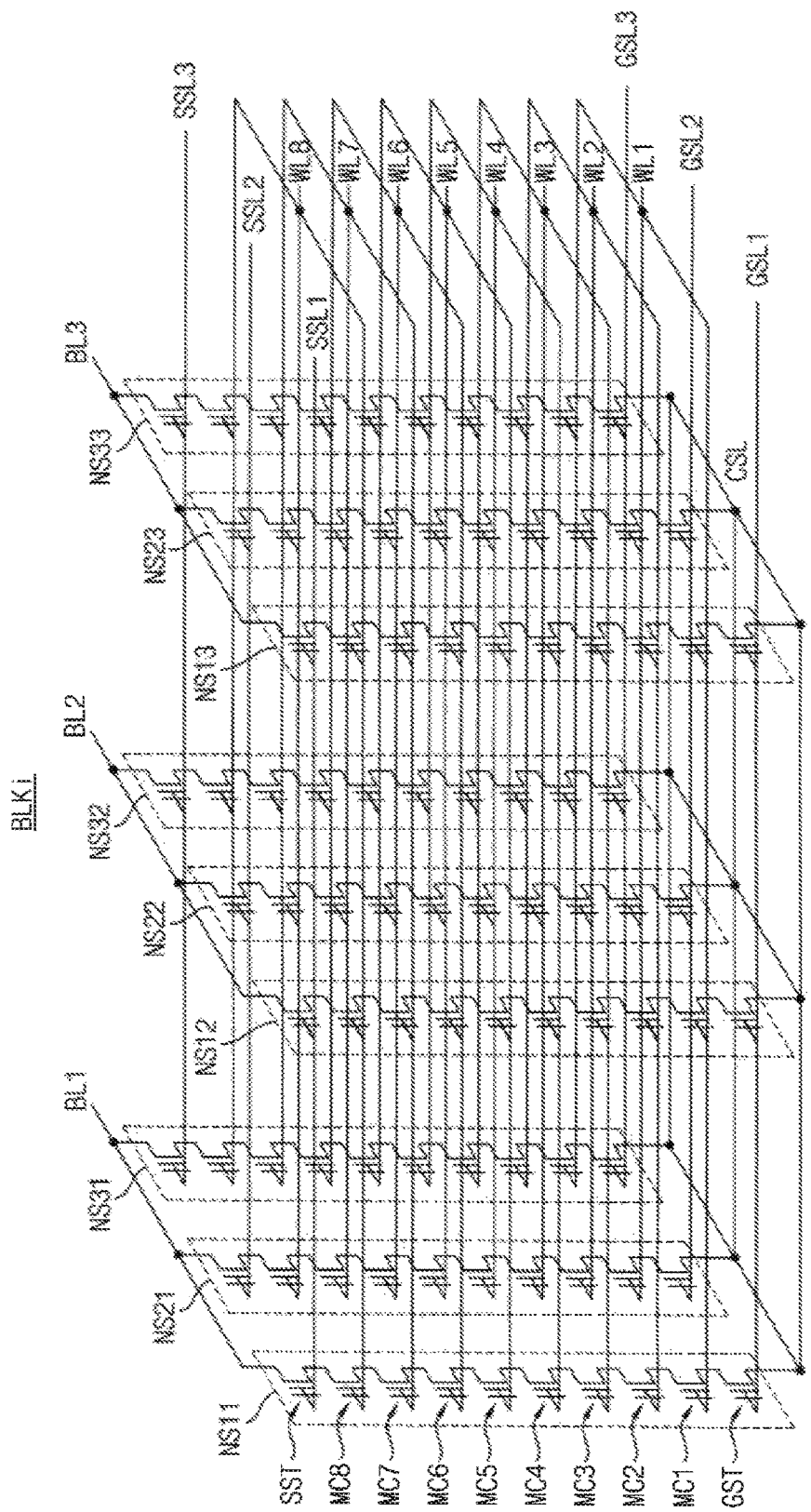
FIG. 6 is a circuit diagram illustrating an equivalent circuit of the memory block described with reference to FIG. 5 according to exemplary embodiments.

FIG. 6 is a circuit diagram illustrating an equivalent circuit of the memory block described with reference to FIG. 5 according to exemplary embodiments.

The memory block BLKi of FIG. 6 may be formed on a substrate in a three-dimensional structure (or a vertical structure). For example, a plurality of memory cell strings included in the memory block BLKi may be formed in a direction perpendicular to the substrate.

Referring to FIG. 6, the memory block BLKi may include memory cell strings NS11 to NS33 coupled between bit-lines BL1, BL2 and BL3 and a common source line CSL.

Each of the memory cell strings NS11 to NS33 may include a string selection transistor SST, a plurality of memory cells MC1 to MC8, and a ground selection transistor GST. In FIG. 6, each of the memory cell strings NS11 to NS33 is illustrated to include eight memory cells MC1 to MC8. However, exemplary embodiments are not limited thereto. In some exemplary embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 6, the memory block BLKi is illustrated to be coupled to eight word-lines WL1 to WL8 and three bit-lines BL1 to BL3. However, exemplary embodiments are not limited thereto. In some exemplary embodiments, the memory cell array 100 may be coupled to any number of word-lines and bit-lines.

Referring back to FIG. 3, the control circuit 450 may receive a command (signal) CMD and an address (signal) ADDR from the memory controller 20 and control an erase loop, a program loop and a read operation of the nonvolatile memory device 30 based on the command signal CMD and the address signal ADDR. The program loop may include a program operation and a program verification operation. The erase loop may include an erase operation and an erase verification operation. The read operation may include a normal read operation and data recover read operation.

In example embodiments, the control circuit 450 may generate the control signals CTLs, which are used for controlling the voltage generator 700, and may generate the page buffer control signal PBC for controlling the page buffer circuit 410, based on the command signal CMD, and generate the row address R_ADDR and the column address C_ADDR based on the address signal ADDR. The control circuit 450 may provide the row address R_ADDR to the address decoder 430 and provide the column address C_ADDR to the data input/output circuit 420.

The control circuit 450 may include the look-up table 460. The look-up table 460 may store levels of recover read voltage applied to a first word-line based on program states of memory cells of a second word-line adjacent to the first word-line and a time after a program operation performed on the memory cells is completed (retention time) which the control circuit 450 uses when the nonvolatile memory device 30 performs the data recover read operation. In addition, the look-up table 460 may store levels of recover read voltage based on the program states of memory cells of the second word-line and an operating temperature of the nonvolatile memory device 30. When the nonvolatile memory device 30 performs the data recover read operation, the control circuit 450 may adjust the level of the recover read voltage by referring to the look-up table 460. The program states (e.g., 2 program states, 4 program states, 8 program states, 16 program states, etc.) can individually store an integer number of bits per cell.

The address decoder 430 may be coupled to the memory cell array 100 through the string selection line SSL, the plurality of word-lines WLs, and the ground selection line GSL. During the program operation or the read operation, the address decoder 430 may determine one of the plurality of word-lines WLs as a selected word-line and determine rest of the plurality of word-lines WLs except for the selected word-line as unselected word-lines based on the row address R_ADDR.

The voltage generator 700 may generate word-line voltages VWLs, which are required for the operation of the memory cell array 100 of the nonvolatile memory device 30, based on the control signals CTLs. The voltage generator 700 may receive the power PWR from the memory controller 20. The word-line voltages VWLs may be applied to the plurality of word-lines WLs through the address decoder 430.

For example, during the erase operation, the voltage generator 700 may apply an erase voltage to a well of a memory block and may apply a ground voltage to entire word-lines of the memory block. During the erase verification operation, the voltage generator 700 may apply an erase verification voltage to the entire word-lines of the memory block or sequentially apply the erase verification voltage to word-lines in a word-line basis.

For example, during the program operation, the voltage generator 700 may apply a program voltage to the selected word-line and may apply a program pass voltage to the unselected word-lines. In addition, during the program verification operation, the voltage generator 700 may apply a program verification voltage to the first word-line and may apply a verification pass voltage to the unselected word-lines.

In addition, during the normal read operation, the voltage generator 700 may apply a read voltage to the selected word-line and may apply a read pass voltage to the unselected word-lines. During the data recover read operation, the voltage generator 700 may apply the read voltage to a word-line adjacent to the selected word-line and may apply a recover read voltage to the selected word-line.

The page buffer circuit 410 may be coupled to the memory cell array 100 through the plurality of bit-lines BLs. The page buffer circuit 410 may include a plurality of page buffers. In some exemplary embodiments, one page buffer may be connected to one bit-line. In other exemplary embodiments, one page buffer may be connected to two or more bit-lines.

The page buffer circuit 410 may temporarily store data to be programmed in a selected page or data read out from the selected page of the memory cell array 100.

The data input/output circuit 420 may be coupled to the page buffer circuit 410 through data lines DLs. During the program operation, the data input/output circuit 410 may receive program data DATA from the memory controller 20 and provide the program data DATA to the page buffer circuit 410 based on the column address C_ADDR received from the control circuit 450. During the read operation, the data input/output circuit 420 may provide read data DATA, which are stored in the page buffer circuit 410, to the memory controller 20 based on the column address C_ADDR received from the control circuit 450.

In addition, the page buffer circuit 410 and the data input/output circuit 420 read data from a first area of the memory cell array 100 and write the read data to a second area of the memory cell array 100. That is, the page buffer circuit 410 and the data input/output circuit 420 may perform a copy-back operation.

Figure 7:
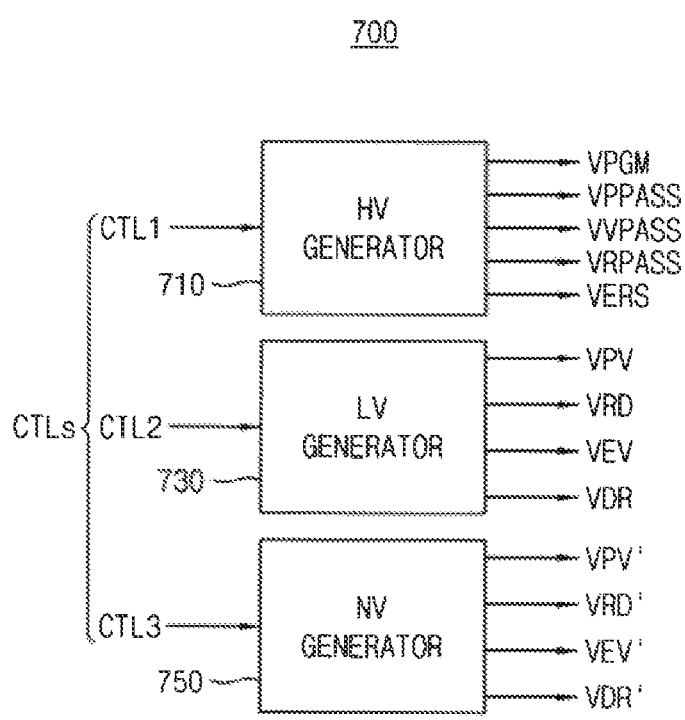
FIG. 7 is a block diagram illustrating a voltage generator in the nonvolatile memory device of FIG. 3 according to exemplary embodiments.

FIG. 7 is a block diagram illustrating the voltage generator in the nonvolatile memory device of FIG. 3 according to exemplary embodiments.

Referring to FIG. 7, the voltage generator 700 may include a high voltage generator 710 and a low voltage generator 730. The voltage generator 700 may further include a negative voltage generator 750.

The high voltage generator 710 may generate a program voltage VPGM, a program pass voltage VPPASS, a verification pass voltage VVPASS, a read pass voltage VRPASS and an erase voltage VERS according to operations directed by a decoded command by the control circuit 450, in response to a first control signal CTL1 of the control signals CTLs. The program voltage VPGM is applied to the selected word-line, the program pass voltage VPPASS, the verification pass voltage VVPASS, the read pass voltage VRPASS may be applied to the unselected word-lines and the erase voltage VERS may be applied to the well of the memory block. The first control signal CTL1 may include a plurality of bits which indicate the operations directed by the decoded command.

The low voltage generator 730 may generate a program verification voltage VPV, a read voltage VRD, an erase verification voltage VEV and a recover read voltage VDR according to operations directed by decoded command by the control circuit 450, in response to a second control signal CTL2 of the control signals CTLs. The program verification voltage VPV, the read voltage VRD and the erase verification voltage VEV may be applied to the selected word-line according to operation of the nonvolatile memory device 30. The second control signal CTL2 may include a plurality of bits which indicate the operations directed by the decoded command.

The negative voltage generator 750 may generate a program verification voltage VPV', a read voltage VRD', an erase verification voltage VEV' and a recover read voltage VDR' which have negative levels according to operations directed by decoded command by the control circuit 450, in response to a third control signal CTL3 of the control signals CTLs. The third control signal CTL3 may include a plurality of bits which indicate the operations directed by the decoded command.

FIG. 8 is a circuit diagram illustrating one of page buffers in the page buffer circuit in the nonvolatile memory device of FIG. 3 according to exemplary embodiments.

Referring to FIG. 8, a page buffer PB includes a pre-charge circuit 411, a switch circuit 412 and a sense and latch circuit 413.

The pre-charge circuit 411, the switch circuit 412 and the sense and latch circuit 413 of the page buffer PB may operate responsive to a control signal PBC of the control circuit 450. The control signal PBC may include a load signal LOAD, a bit-line voltage control signal BLSHF, a bit-line selection signal BLSLT, a shield signal SHLD, and so on.

The pre-charge circuit 411 may supply a pre-charge voltage Vdd to a sensing node SO. The pre-charge circuit 411 may include a pre-charge transistor TPR which is turned on or off according to the load signal LOAD.

The switch circuit 412 may include transistors M1, M2, and M3. The transistor M1 may pre-charge the bit-line BL1 to a predetermined voltage level in response to the bit-line voltage control signal BLSHF. The transistor M2 may select the bit-line BL1 in response to the bit-line selection signal BLSLT. The transistor M3 may discharge the bit-line BL1 in response to the shield signal SHLD.

The sense and latch circuit 413 may detect a voltage level of the sensing node SO. Data may be latched according to the detected voltage level of the sensing node SO. The sense and latch circuit 413 may include a latch 414 and transistors T1 to T4. The latch circuit 414 includes inverters INV1 and INV2. The transistor T1 includes a gate receiving a set signal SET, the transistor T2 includes a gate receiving a reset signal RST, the transistor T3 includes a gate receiving a refresh signal REF and the transistor T4 includes a gate coupled to the sensing node SO. The sense and latch circuit 413 may operate responsive to control signals SET, RST and REF included in the control signal PBC.

Figure 9:
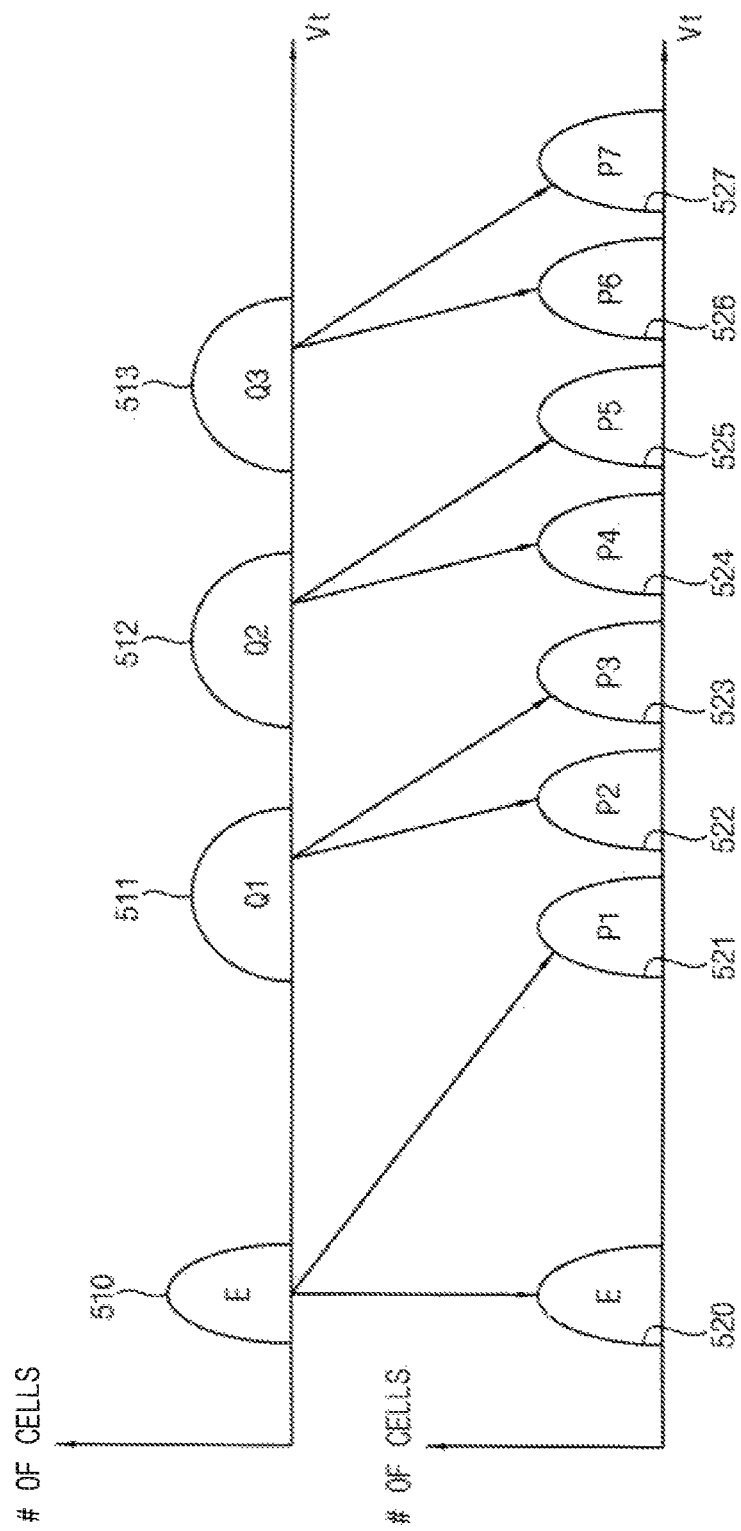
FIGS. 9 and 10 are diagrams illustrating program methods for reducing word-line coupling.
Figure 10:
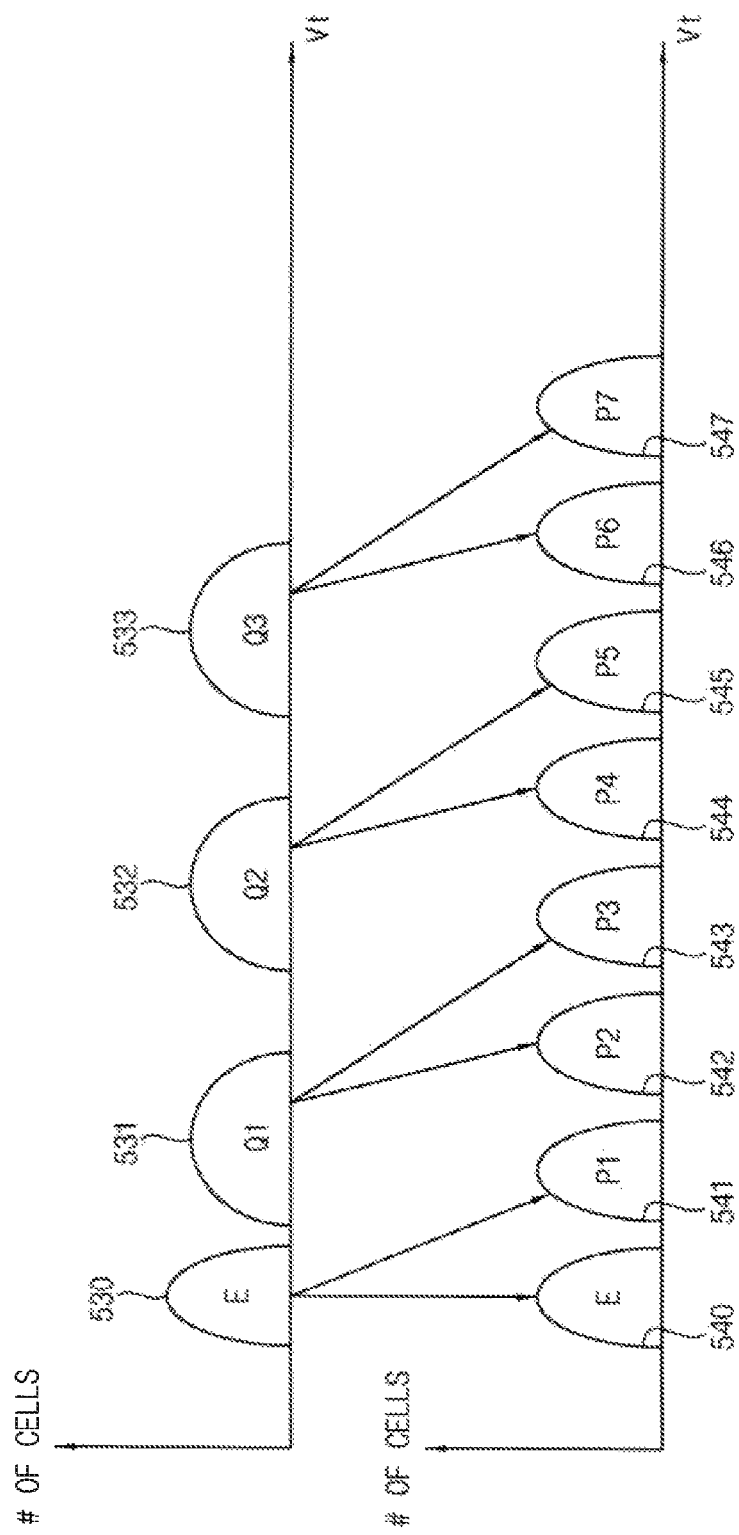

FIGS. 9 and 10 are diagrams illustrating program methods for reducing word-line coupling.

FIG. 9 illustrates a program method for reducing word-line coupling which will be performed under the assumption that each memory cell stores 3-bit data.

In FIG. 9, curves 510 to 513 illustrate threshold voltage distributions for memory cells after a lower 2-page program procedure representing logic states, for example, of "00", "01", "10", and "11", and curves 520 to 527 illustrate threshold voltage distributions for memory cells after an upper 1-page program procedure representing logic states, for example, of "000", "001", "010", "011", "100", "101", "110", and "111".

The program states, for example, 2 program states, 4 program states, 8 program states, 16 program states, etc., can individually store an integer number of bits per cell.

After lower and upper pages are programmed, as illustrated in FIG. 9 memory cells may have any one of eight data states E (erase) and P1 to P7.

In a case of a method illustrated in FIG. 9, memory cells in the threshold voltage distribution 510 are programmed to a threshold voltage distribution 520 or a threshold voltage distribution 521 after the low 2-page programming, and memory cells in the threshold voltage distribution 511 are programmed to a threshold voltage distribution 522 or a threshold voltage distribution 523 after the low 2-page programming. Memory cells in the threshold voltage distribution 512 are programmed to a threshold voltage distribution 524 or a threshold voltage distribution 525 after the low 2-page programming, and memory cells in the threshold voltage distribution 513 are programmed to a threshold voltage distribution 526 or a threshold voltage distribution 527 after the low 2-page programming.

FIG. 10 illustrates a program method for reducing word-line coupling which will be performed under the assumption that each memory cell stores 3-bit data.

In FIG. 10, curves 530 to 533 illustrate threshold voltage distributions for memory cells after a lower 2-page program procedure, and curves 540 to 547 illustrate threshold voltage distributions for memory cells after an upper 1-page program procedure. After lower and upper pages are programmed, as illustrated in FIG. 10, memory cells may have any one of eight data states E and P1 to P7.

In a case of a method illustrated in FIG. 10, memory cells in the threshold voltage distribution 530 are programmed to a threshold voltage distribution 540 or a threshold voltage distribution 541 after the low 2-page programming, and memory cells in the threshold voltage distribution 531 are programmed to a threshold voltage distribution 542 or a threshold voltage distribution 543 after the low 2-page programming. Memory cells in the threshold voltage distribution 532 are programmed to a threshold voltage distribution 544 or a threshold voltage distribution 545 after the low 2-page programming, and memory cells in the threshold voltage distribution 533 are programmed to a threshold voltage distribution 546 or a threshold voltage distribution 547 after the low 2-page programming.

The program method described in FIG. 10 is different from that in FIG. 9 in that negative verification voltages are used. That is, in the case of the program method described in FIG. 9, verification voltages each corresponding to program states P1 to P7 may be set to positive voltages (e.g., 0.1V, 1.0V, 1.9V, 2.8V, 3.7V, 4.6V, 5.5V), respectively. In other words, each of the program states P1 to P7 may be judged with a positive voltage being applied to a selected word line. On the other hand, in the case of the program method described in FIG. 10, verification voltages each corresponding to program states P1 and P2 may be set to negative voltages (e.g., −1.5V, −0.6V), and verification voltages each corresponding to program states P3 to P7 may be set to positive voltages (e.g., 0.3V, 1.2V, 2.1V, 3.0V, 3.9V). In other words, one or more ones of the program states P1 to P7 may be judged with a negative voltage being applied to a selected word line. It is well understood that the number of program states (or, data states) judged by a negative voltage is not limited to this disclosure.

Figure 11:
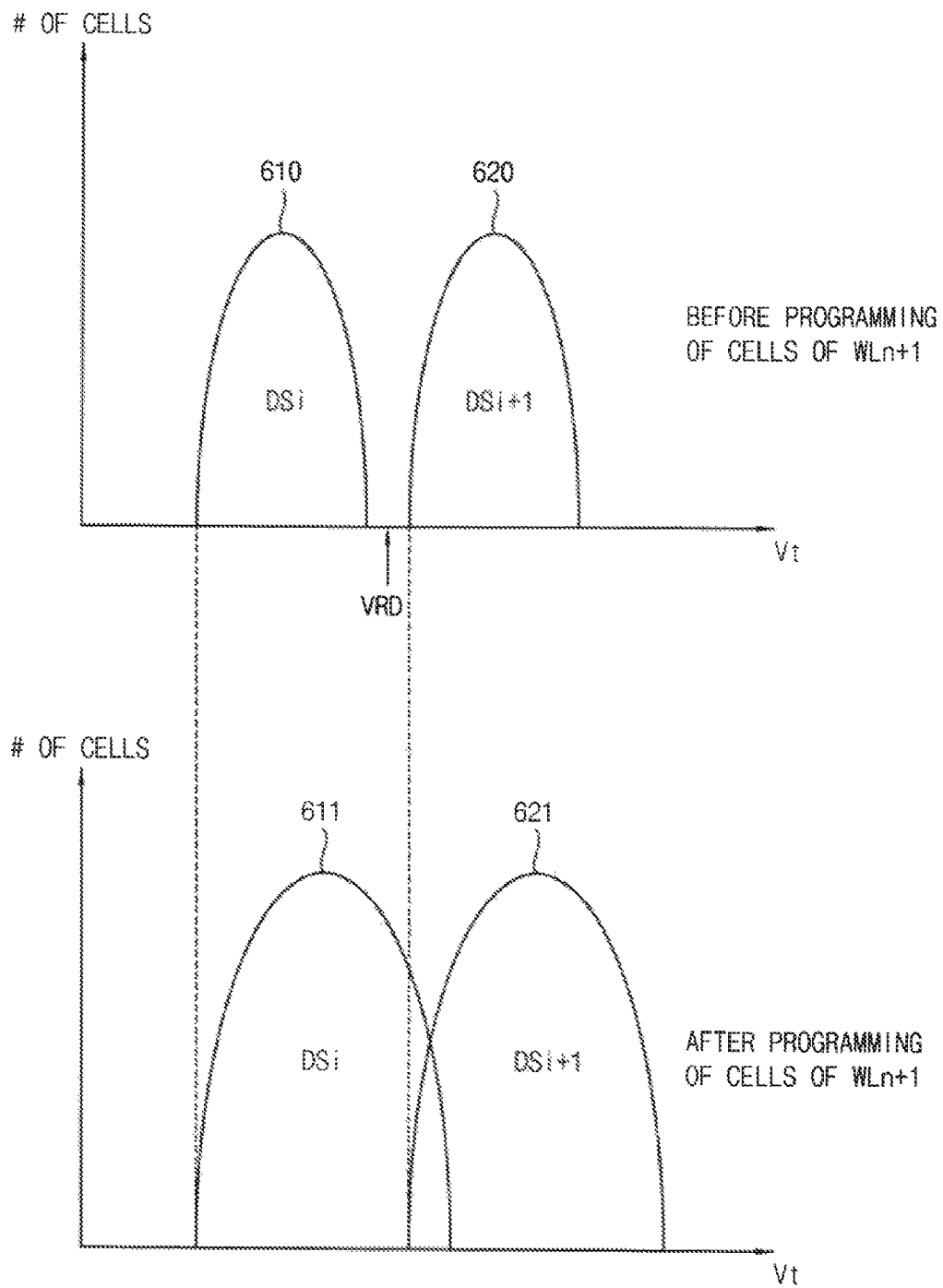
FIG. 11 is a diagram illustrating threshold voltage distributions associated with memory cells of an nth word line before and after word line coupling caused when memory cells of a (n+1)th word line are programmed.

FIG. 11 is a diagram illustrating threshold voltage distributions associated with memory cells of an nth word line before and after word line coupling caused when memory cells of a (n+1)th word line are programmed.

An example in FIG. 11 illustrates two adjacent threshold voltage distributions 610 and 620 associated with memory cells of an nth word line before programming of memory cells of a (n+1)th word line, that is, before word line coupling. The (n+1)th word line may be an upper word-line or a lower word-line of the nth word-line. For example, the (n+1)th word-line is one of word-lines physically located adjacent to the nth word-line.

In FIG. 11, there are illustrated two threshold voltage distributions. But, it is well understood that more threshold voltage distributions may be provided according to a bit number per cell. The number of threshold voltage distributions may be determined according to the number of data bits stored in a memory cell. For example, when m-bit data (m being 2 or more integer) is stored in a memory cell, threshold voltage distributions may be provided. For example, when 3-bit data is stored in a memory cell, a number of threshold voltage distributions is 8 (e.g., 8 program states, or an erase state and P1 to P7 program states) and when 4-bit data is stored in a memory cell a number of threshold voltage distributions is 16 (e.g., 16 program states, or an erase state and P1 to P15 program states). Threshold voltage distributions 610 and 620 may be judged using a read voltage VRD between threshold voltage distributions 610 and 620. Although not illustrated in FIG. 11, remaining threshold voltage distributions may be judged using a read voltage between adjacent threshold voltage distributions. This read operation is named a normal read operation, and the read voltage VRD used at the normal read operation is named a normal read voltage.

Threshold voltage distributions 611 and 621 illustrated in FIG. 11 illustrate threshold voltage distributions associated with memory cells of the nth word line after experiencing word line coupling which is caused when memory cells of the (n+1)th word line are programmed. The threshold voltage distributions 611 and 621 may include threshold voltage distributions associated with memory cells experiencing word line coupling and memory cells not experiencing word line coupling when memory cells of the (n+1)th word line are programmed.

Figure 12:
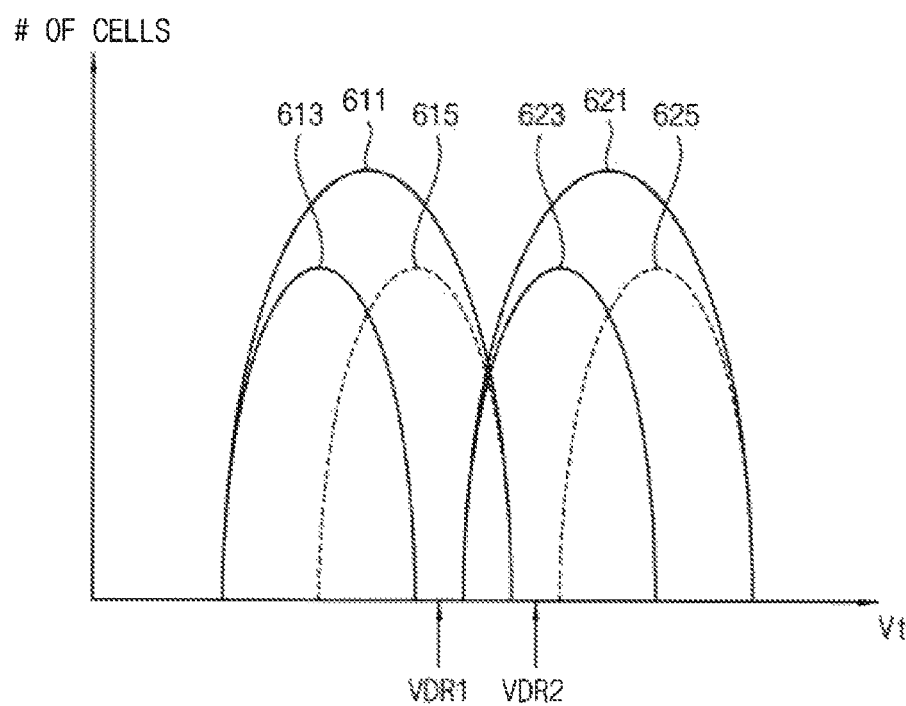
FIG. 12 is a diagram illustrating all threshold voltage distributions in FIG. 11 including coupled and uncoupled memory cells according to exemplary embodiments.

FIG. 12 is a diagram illustrating all threshold voltage distributions in FIG. 11 including coupled and uncoupled memory cells according to exemplary embodiments.

In an example of FIG. 12, threshold voltage distributions 613 and 623 illustrate threshold voltage distributions of memory cells (or, uncoupled memory cells) which do not experience a threshold voltage shift due to word line coupling. Threshold voltage distributions 615 and 625 illustrate threshold voltage distributions of memory cells (or, coupled memory cells) which experience a threshold voltage shift due to word line coupling. That is, the threshold voltage distributions 615 and 625 indicate a threshold voltage shift of memory cells which was programmed to data states 613 and 623.

Programmed memory cells of an nth word line may belong to uncoupled threshold voltage distributions 613 and 623 or to coupled threshold voltage distributions 615 and 625, based on a threshold voltage shift caused by programming of memory cells of the (n+1)th word line. As illustrated in FIG. 12, a first recover read voltage VDR1 may be used to read uncoupled memory cells, that is, to discriminate memory cells within threshold voltage distributions 613 and 623. A second recover read voltage VDR2 may be used to read coupled memory cells, that is, to discriminate memory cells within threshold voltage distributions 615 and 625.

Two read operations may be executed with respect to one threshold voltage distribution (or, a data state) (formed of a coupled distribution and an uncoupled distribution) using the first and second recover read voltages VDR1 and VDR2 in order to reduce the read error due to word line coupling. The number of read operations executed with respect to one data state may be determined according to the number of groups formed of aggressor cells (or, program states causing the coupling). For example, aggressor cells constitute one group (or, one set) or two or more groups (or, two or more sets). If aggressor cells constitute one group, a read operation may be carried out twice, once for the uncoupled nth word lines, and once for the coupled nth word lines. If aggressor cells constitute two groups, a read operation may be carried out three times, once for the uncoupled nth word lines, and twice for the two groups of coupled nth word lines. As an example, when 3-bit data is stored in a memory cell and aggressor cells constitute one group, the one group may be determined as P4~P7. As another example, when 3-bit data is stored in a memory cell and aggressor cells constitute two groups, the two groups may be determined as P1~P3 and P4~P7. As still another example, when 3-bit data is stored in a memory cell and aggressor cells constitute seven groups, the seven groups may be determined as each program state of P1~P7.

Referring to FIG. 12 which illustrates a read operation executed when aggressor cells constitute one group, a read operation using the first recover read voltage VDR1 is performed to discriminate memory cells within the uncoupled distributions 613 and 623, and a read operation using the second recover read voltage VDR2 is performed to discriminate memory cells within the coupled distributions 615 and 625.

Memory cells to be read using the first recover read voltage VDR1 and memory cells to be read using the second recover read voltage VDR2 may be divided based on data read from the memory cells of the upper (or, lower) word-line (e.g., (n+1)th word-line).

In an exemplary embodiment, in a case of 3-bit data, if aggressor cells constitute one group, they may be memory cells programmed to have program states P1, P3, P5 and P7 as illustrated in FIGS. 9 and 10. In another exemplary embodiment, in a case of 3-bit data, if aggressor cells constitute one group, they may be memory cells programmed to have at least three program states among program states P1, P3, P5 and P7 illustrated in FIGS. 9 and 10. In still another exemplary embodiment, in a case of 3-bit data, if aggressor cells constitute one group, they may be memory cells programmed to have at least four program states P4, P5, P6, and P7 among program states illustrated in FIGS. 9 and 10.

If aggressor cells constitute two groups, they may be memory cells programmed to have a program state P1 in FIG. 9 and remaining program states P2 to P7 therein. But, program states to define groups of aggressor cells are not limited thereto. For example, program states to define groups of aggressor cells can be determined variously according to a program manner and a coupling level. Alternatively, the number of aggressor cell groups (or, program states in each group) may be determined considering a program-erase cycle. For example, after a predetermined program-erase cycle elapses, program states of aggressor cells can be reconfigured based on an error rate. Program states (P1, P3, P5, P7), (P2 to P7), or (P4 to P7) within one aggressor cell group may be reconfigured to two or more groups.

In example embodiments, a level of the second recover read voltage VDR2 used for reading memory cells of the threshold voltage distribution 611 may be variable. As an example, a voltage level of the second recover read voltage VDR2 applied to the nth word-line when memory cells of the adjacent word-line (n+1)th word-line have P7 program state may be greater than the voltage level of the second recover read voltage VDR2 when memory cells of the adjacent word-line (n+1)th word-line have P1 program state. As another example, a voltage level of the second recover read voltage VDR2 when memory cells of the adjacent word-line (n+1)th word-line have one of a first set of program states including an uppermost program state may be greater than a voltage level of the second recover read voltage VDR2 when memory cells of the adjacent word-line (n+1)th word-line have one of a second set of program states including a lowermost program state.

In example embodiments, the low voltage generator 730 of the voltage generator 700 may generate a plurality of voltage levels of the data recover voltage VDR. The low voltage generator 730 may select one of the plurality of voltage levels of VDR in response to the second control signal CTL2.

In FIG. 12, in addition, the threshold voltage distributions 611 and 621 associated with the memory cells of the nth word-line tend to be widened toward in a positive direction (that is, an increasing direction) of the threshold voltage Vt as the time after a program operation performed on the memory cells is completed (retention time) increases when the threshold voltage distributions 611 and 621 are threshold voltage distributions representing lower program states (e.g., P1 and P2). The threshold voltage distributions 611 and 621 tend to be widened toward in a negative direction (that is, a decreasing direction) along the threshold voltage Vt as the retention time increases when the threshold voltage distributions 611 and 621 are threshold voltage distributions representing upper program states (e.g., P6 and P7).

In example embodiments, a level of the second recover read voltage VDR2 used for reading memory cells of the threshold voltage distribution 611 (e.g., lower program state, such as P1 or P2) may be variable. As an example, a voltage level of the second recover read voltage VDR2 applied to the nth word-line when the retention time of memory cells of the nth word-line is 10,000 sec may be greater than a voltage level of the second recover read voltage VDR2 when the retention time of the memory cells is 10 sec.

In example embodiments, a time when the program operation on the memory cells is completed may be stored in a meta area of a page of the memory cells as a time stamp. The control circuit 450 may include a timer to calculate the retention time. The timer may be implemented with software or firmware. The control circuit 450 may calculate the retention time of the memory cells based on the time stamp stored in the meta area and a current time provided by the timer.

In addition, widened amount of the threshold voltage distributions 611 and 621 associated with the memory cells of the nth word-line may depend on program states of memory cells of the (n+1)th word-line. For example, when each of the memory cells of the (n+1)th word-line has the seventh program state P7 in FIGS. 9 and 10, widened amount of the threshold voltage distribution of the memory cells of the nth word-line, having the first program state P1 may be greater than widened amount of the threshold voltage distribution of the memory cells of the nth word-line, having the seventh program state P7.

For example, levels of the first and second recover read voltages VDR1 and VDR2 may be adjusted based on the retention time of the memory cells of the nth word-line and/or a difference between a program state of the memory cells of the (n+1)th word-line and a program state of the memory cells of the nth word-line.

Figure 13:
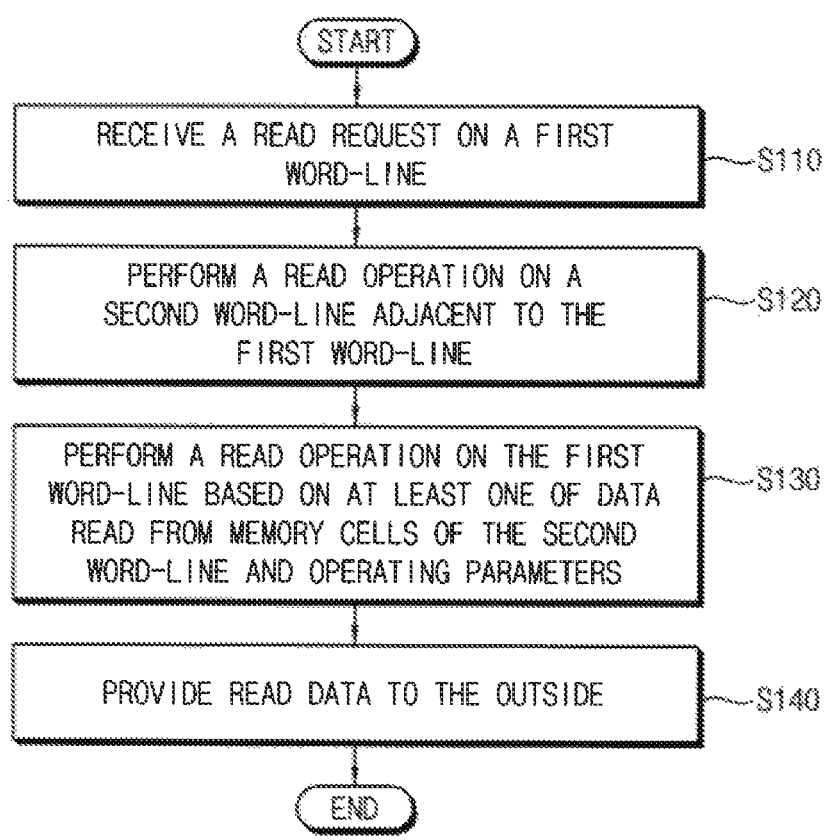
FIG. 13 is a flow chart illustrating a method of reading data in a nonvolatile memory device according to exemplary embodiments.

FIG. 13 is a flow chart illustrating a method of reading data in a nonvolatile memory device according to exemplary embodiments.

Referring to FIGS. 1 through 13, in a method of reading data in a nonvolatile memory device 30 including a plurality of memory cells arranged at intersections of a plurality of word-lines and a plurality of bit-lines, the nonvolatile memory device 30 receives a read request on a first word-line of the plurality of word-lines from the memory controller (S110). The read request may be a read command CMD provided from the memory controller 20. The nonvolatile memory device 30 performs a read operation on a second word-line (an upper or a lower word-line with respect to the first word-line) adjacent to the first word-line using a normal read voltage VRD (S120). Data read from the memory cells of the second word-line may be latched corresponding page buffers in the page buffer circuit 410.

The nonvolatile memory device 30 performs a read operation on the first word-line based on the data read from the second word-line (S130). The nonvolatile memory device 30 performs a read operation on the first word-line by adjusting a level of a recover read voltage VRD applied to the first word-line based on at least one of program states of the data read from the memory cells of the second word-line and an operating parameter of the nonvolatile memory device 30. The operating parameter may be the retention time and an operating temperature of the nonvolatile memory device 30.

The operating temperature may be provided from a temperature sensor included in the nonvolatile memory device 30. The control circuit 450 may adjust the level of the recover read voltage VDR applied to the first word-line by referring to the look-up table as mentioned above.

The nonvolatile memory device 30 may provide the read data to the memory controller 20 (S140).

As described with reference to FIGS. 9 through 12, as an example, each memory cell stores 3-bit data and is programmed to have one of the first to seventh program states P1 to P7. As another example, each memory cell may store 3-bit data and may be programmed to have one of erase state E and the first to seventh program states P1 to P7.

A level of the recover read voltage when each of the memory cells of the second word-line has the first program state P1 may be smaller than a level of the recover read voltage when each of the memory cells of the second word-line has the seventh program state P7.

When each of the memory cells of the second word-line has the first program state P1, the level of the recover read voltage may increase as the retention time of memory cells of the first word-line increases. In addition, when each of the memory cells of the second word-line has the first program state P1, the level of the recover read voltage may increase as the operating temperature of the nonvolatile memory device 30 increases.

Figure 14:
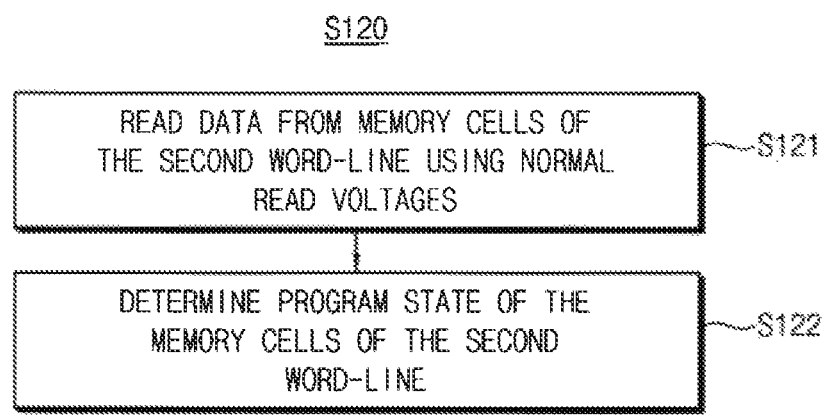
FIG. 14 illustrates that the read operation on the second word-line is performed in the method of FIG. 13 according to exemplary embodiments.

FIG. 14 illustrates that the read operation on the second word-line is performed in the method of FIG. 13 according to exemplary embodiments.

Referring to FIG. 14, the nonvolatile memory device 30 performs the read operation on the second word-line (S120) by reading data from the memory cells of the second word-line using the normal read voltage VRD (S121) and determining the program state of the memory cells of the second word-line (S122).

Figure 15:
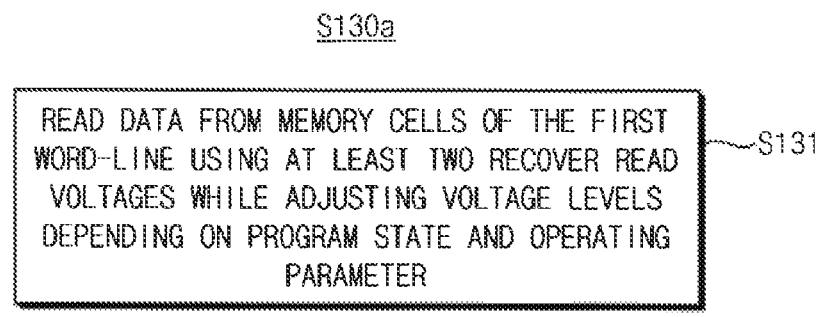
FIG. 15 illustrates that the read operation on the first word-line is performed in the method of FIG. 13 according to exemplary embodiments.

FIG. 15 illustrates that the read operation on the first word-line is performed in the method of FIG. 13 according to exemplary embodiments.

Referring to FIG. 15, the nonvolatile memory device 30 performs the read operation on the first word-line (S130) by reading data from the memory cells of the second word-line using at least two recover read voltages VDR1 and VDR2 while adjusting levels of the recover read voltages VDR1 and VDR2 based on the program states of the memory cells of the second word-line and the operating parameter. The operating parameter may be at least one of the retention time of the memory cells of the first word-line and the operating temperature of the nonvolatile memory device 30.

Figure 16:
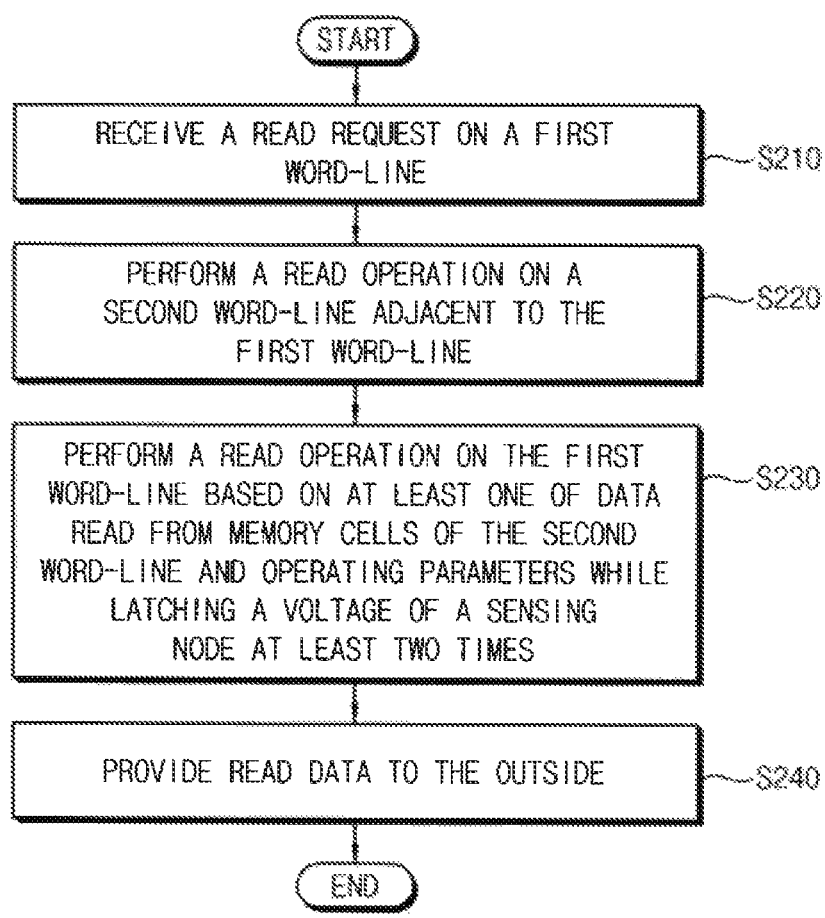
FIG. 16 is a flow chart illustrating a method of reading data in a nonvolatile memory device according to exemplary embodiments.

FIG. 16 is a flow chart illustrating a method of reading data in a nonvolatile memory device according to exemplary embodiments.

Referring to FIGS. 1 through 12 and 16, in a method of reading data in a nonvolatile memory device 30 including a plurality of memory cells arranged at intersections of a plurality of word-lines and a plurality of bit-lines, the nonvolatile memory device 30 receives a read request on a first word-line of the plurality of word-lines from the memory controller (S210). The read request may be a read command CMD provided from the memory controller 20. The nonvolatile memory device 30 performs a read operation on a second word-line (an upper or a lower word-line with respect to the first word-line) adjacent to the first word-line using a normal read voltage VRD (S220). Data read from the memory cells of the second word-line may be latched corresponding page buffers in the page buffer circuit 410.

The nonvolatile memory device 30 performs a read operation on the first word-line based on the data read from memory cells of the second word-line (S230). The nonvolatile memory device 30 performs a read operation on the first word-line by latching a voltage of each sensing node corresponding to each of the bit-lines at least two times as first data and second data based on at least one of a program state of the data read from memory cells of the second word-line and an operating parameter of the nonvolatile memory device 30 with maintaining a level of recover read voltage applied to the first word-line. The operating parameter may be at least one of the retention time and an operating temperature of the nonvolatile memory device 30. The nonvolatile memory device 30 may provide the read data to the memory controller 20 (S240).

FIG. 17 illustrates that the read operation on the first word-line is performed in the method of FIG. 16 according to exemplary embodiments.

Referring to FIG. 17, the nonvolatile memory device 30 performs the read operation on the first word-line (S230) by reading data from the memory cells of the second word-line using a recover read voltage VDR2 while adjusting develop time of the sensing node based on at least one of the program state of the memory cells of the second word-line and the operating parameter (S231).

Figure 18:
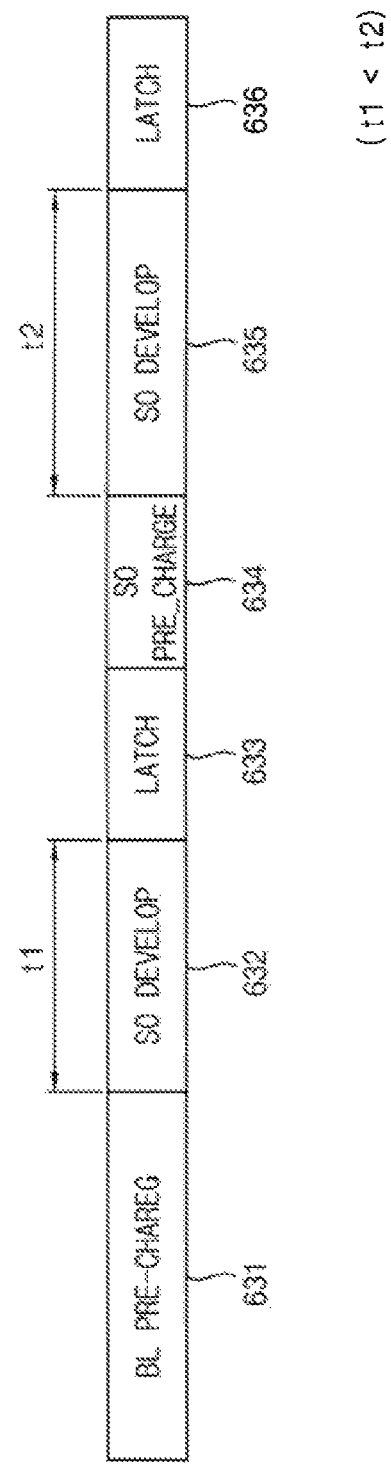
FIG. 18 illustrates a diagram for explaining a read operation on the first word-line according to exemplary embodiments.

FIG. 18 is diagram for explaining a read operation on the first word-line according to exemplary embodiments.

Referring to FIGS. 8 and 18, the read operation on the first word-line may include a bit-line pre-charge period 631, a sensing node develop period 632, a latch period 633, a sensing node pre-charge period 634, a sensing node develop period 635 and a latch period 636. The read operation on the first word-line may further include bit-line recovery period after the latch period 636.

Data of the memory cells of the second word-line are latched in the sense and latch circuit 413 before the bit-line pre-charge period 631. During the bit-line pre-charge period 631, the bit-lines are pre-charged with a predetermined voltage level and the sensing node SO is pre-charged with the power supply voltage Vdd.

During the sensing node develop period 632, supplying of a current to the sensing node SO from the pre-charge circuit 411 may be blocked, and the transistors M1 and M2 may be turned on. With this condition, the sensing node SO may be developed along different slopes during a develop t1 according to the latched program state of the memory cells of the second word-line.

At the latch period 633 following the sensing node develop period 632, a latch operation may be performed via the latch 414, and data of the memory cells of the first word-line are latched. The sensing node SO may be pre-charged at the sensing node pre-charge period 634 following the latch period 633. During the sensing node develop period 635, supplying of a current to the sensing node SO from the pre-charge circuit 411 may be blocked, and the transistors M1 and M2 may be turned on. With this condition, the sensing nodes SO may be developed along different slopes during a develop time t2 according to the latched program state of the memory cells of the second word-line. At the latch period 636 following the sensing node develop period 635, a latch operation may be performed via the latch 414, and data of the memory cells of the first word-line are latched.

The develop time t1 corresponding to the sensing node develop period 632 before the sensing node pre-charge period 634 may be set smaller than the develop time t2 corresponding to the sensing node develop period 635 following the sensing node pre-charge period 634. In this case, the develop time t2 may be decided such that memory cells each having a threshold voltage lower than the recover read voltage VDR2 is determined to be an on cell (or, memory cells each having a threshold voltage higher than the recover read voltage VDR2 is determined to be an off cell). As an example, the develop time t1 may be decided such that memory cells corresponding to the threshold voltage distribution 613 are determined to be an on cell and the develop time t2 may be decided such that memory cells corresponding to the threshold voltage distribution 615 are determined to be an on cell.

As an example, each of the develop times t1 and t2 when the data read from the memory cells of the second word-line, having the first program state P1 may be shorter than each of the develop times t1 and t2 when the data read from the memory cells of the second word-line, having the seventh program state P7.

As an example, when the data read from the memory cells of the second word-line have the first program state P1, each of the develop times t1 and t2 may increase as the retention time of the memory cells of the first word-line increases. As another example, when the memory cells of the first word-line have the first program state P1, each of the develop times t1 and t2 may increase as the retention time of the memory cells of the first word-line increases.

Figure 19:
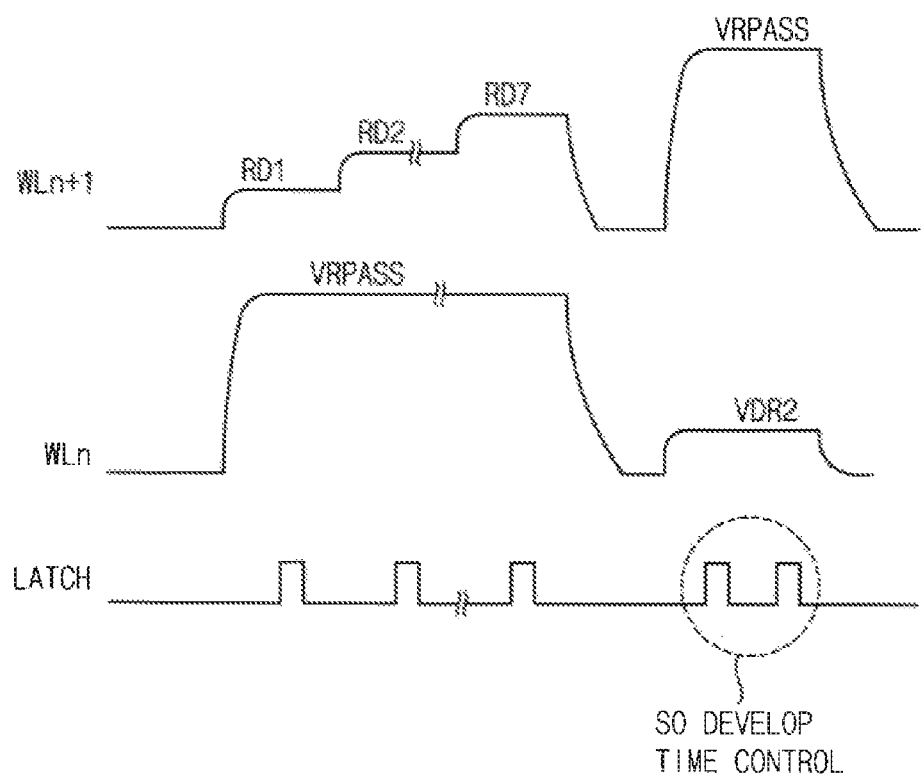
FIG. 19 is a timing diagram for describing a method of reading data in a nonvolatile memory device according to exemplary embodiments.

FIG. 19 is a timing diagram for describing a method of reading data in a nonvolatile memory device according to exemplary embodiments.

Hereinafter, a data recover read operation of a nonvolatile memory device will be more fully described with reference to FIG. 19.

Based on normal read voltages RD1~RD7, data may be read out from memory cells connected to a second word line (e.g., a (n+1)th word line) adjacent to a selected first word line (e.g., an nth word line). The read data may be stored in the page buffer circuit 410. Data may be read out from memory cells connected to the first word-line, based on at least one of program state of the data read from the memory cells of the second word-line and the operating parameter. As described with reference to FIG. 18, consecutive sensing operations (or, latch operations) may be performed with the recover read voltage VDR2 being applied to the first word-line.

Sensing operations for discriminating threshold voltage distributions 613 and 615 and for discriminating threshold voltage distributions 623 and 625 may be consecutively performed using a develop time control scheme described with reference to FIG. 18. With the above description, it is possible to discriminate memory cells having different threshold voltages without a variation in a recover read voltage applied to the first word-line. This may mean that a setup time required to vary a word-line voltage is unnecessary. Further, upon execution of continuous sensing operations, a voltage of a bit-line may be maintained constantly (or, with a pre-charged voltage). That is, it is possible to reduce a time taken to pre-charge a bit-line.

Figure 20:
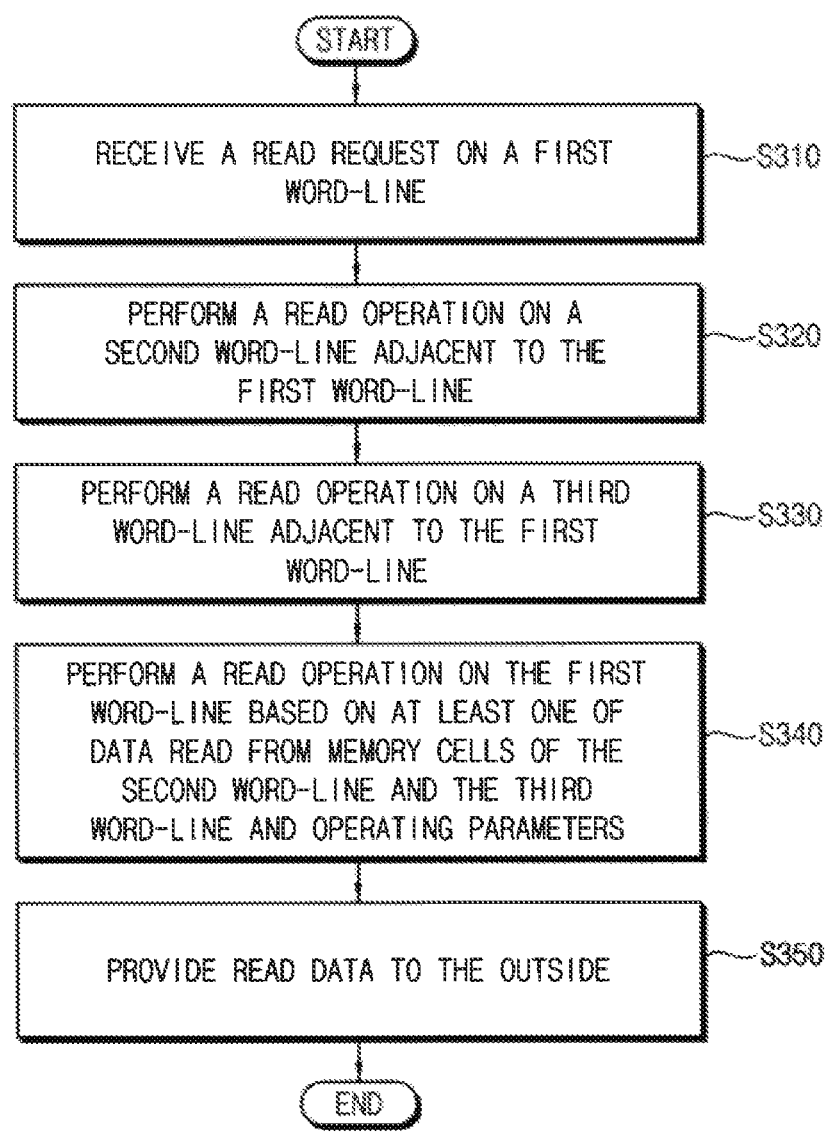
FIG. 20 is a flow chart illustrating a method of reading data in a nonvolatile memory device according to exemplary embodiments.

FIG. 20 is a flow chart illustrating a method of reading data in a nonvolatile memory device according to exemplary embodiments.

Referring to FIGS. 1 through 12 and 20, in a method of reading data in a nonvolatile memory device 30 including a plurality of memory cells arranged at intersections of a plurality of word-lines and a plurality of bit-lines, the nonvolatile memory device 30 receives a read request on a first word-line of the plurality of word-lines from the memory controller (S310). The read request may be a read command CMD provided from the memory controller 20. The nonvolatile memory device 30 performs a read operation on a second word-line (an upper word-line with respect to the first word-line) adjacent to the first word-line using a normal read voltage VRD (S320). Data read from the memory cells of the second word-line may be latched corresponding page buffers in the page buffer circuit 410.

The nonvolatile memory device 30 performs a read operation on a third word-line (a lower word-line with respect to the first word-line) adjacent to the first word-line using the normal read voltage VRD (S330). Data read from the memory cells of the third word-line may be latched corresponding page buffers in the page buffer circuit 410.

The nonvolatile memory device 30 performs a read operation on the first word-line based on the data read from the memory cells of the second word-line and the data read from the memory cells of the third word-line (S340). The nonvolatile memory device 30 performs a read operation on the first word-line by adjusting a level of a recover read voltage VDR applied to the first word-line based on at least one of program state of the data read from the memory cells of the second word-line, program state of the data read from the memory cells of the third word-line and an operating parameter of the nonvolatile memory device. The operating parameter may be one of the retention time and an operating temperature of the nonvolatile memory device 30. The nonvolatile memory device 30 may provide the read data to the memory controller 20 (S350).

As mentioned above, in a method of reading data of a nonvolatile memory device 30 according to exemplary embodiments, data are read from memory cells experiencing word-line coupling from adjacent word-lines by adjusting the level of the recover read voltage applied to a selected word-line or adjusting develop time of the sensing node based on at least one of program state of the data read from at least one adjacent word-line and the operating parameter thereby to enhance performance.

Figure 21:
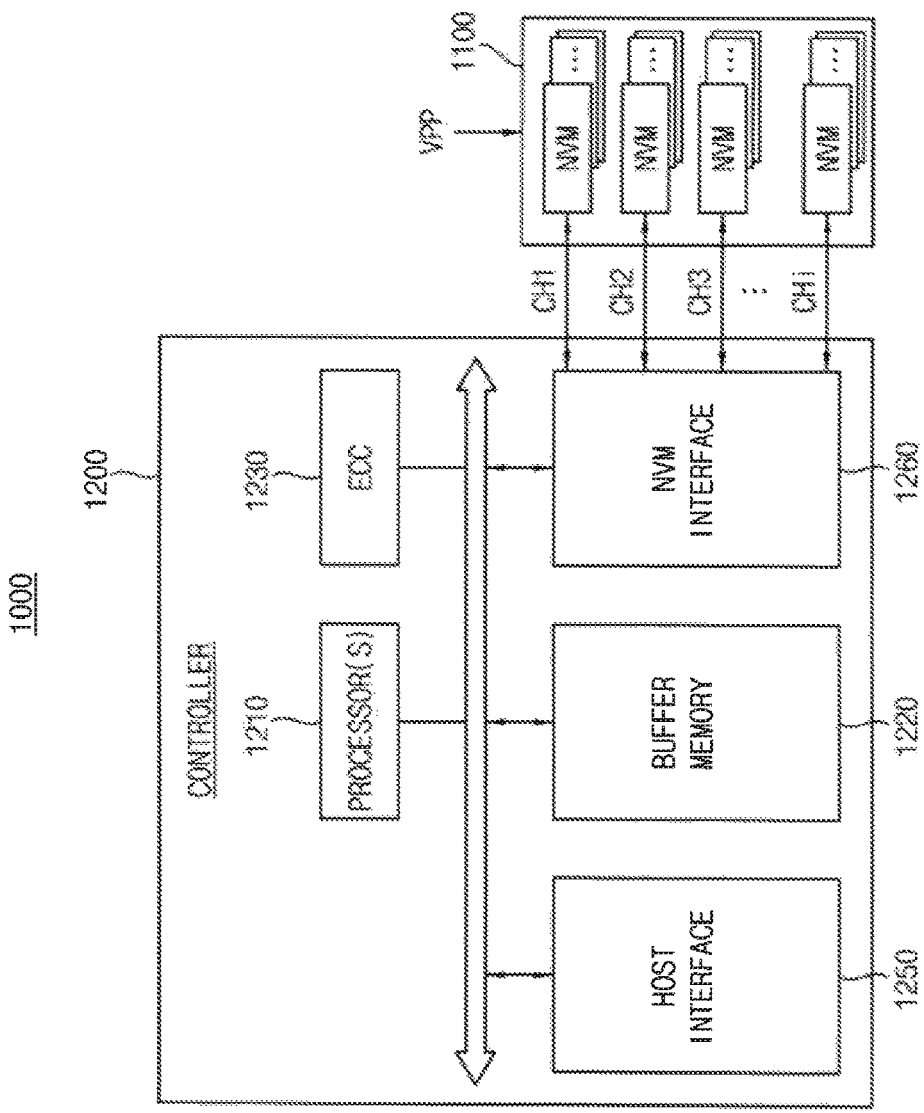
FIG. 21 is a block diagram illustrating a solid state disk or solid state drive (SSD) according to exemplary embodiments.

FIG. 21 is a block diagram illustrating a solid state disk or solid state drive (SSD) according to exemplary embodiments.

Referring to FIG. 21, SSD 1000 includes multiple nonvolatile memory devices 1100 and an SSD controller 1200.

The nonvolatile memory devices 1100 may be optionally supplied with an external high voltage VPP. Each of the nonvolatile memory devices 1100 may include the nonvolatile memory device 30 of FIG. 3. For example, each of the nonvolatile memory devices 1100 reads data from memory cells experiencing word-line coupling from adjacent word-lines by adjusting the level of the recover read voltage applied to a selected word-line or adjusting develop time of the sensing node based on program state of the data read from at least one adjacent word-line and the operating parameter thereby to enhance performance.

The SSD controller 1200 is connected to the nonvolatile memory devices 1100 through multiple channels CH1 to CHi. The SSD controller 1200 includes one or more processors 1210, a buffer memory 1220, an ECC block 1230, a host interface 1250, and a nonvolatile memory interface 1260.

The buffer memory 1220 stores data used to drive the SSD controller 1200. The buffer memory 1220 comprises multiple memory lines each storing data or a command.

The ECC block 1230 calculates error correction code values of data to be programmed at a writing operation and corrects an error of read data using an error correction code value at a read operation. In a data recovery operation, The ECC block 1230 corrects an error of data recovered from the nonvolatile memory devices 1100.

The host interface 1250 provides an interface with an external device. The nonvolatile memory interface 1260 provides an interface with the nonvolatile memory devices 1100.

The present disclosure may be applied to various electronic devices including a nonvolatile memory device. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. A method of reading data in a nonvolatile memory device including a plurality of memory cells arranged at intersections of a plurality of word-lines and a plurality of bit-lines, the method comprising:
receiving a read request on a first word-line of the plurality of word-lines;
performing a read operation on a second word-line adjacent to the first word-line; and
performing a read operation on the first word-line based on data read from memory cells of the second word-line,
wherein performing the read operation on the first word-line comprises adjusting a level of recover read voltage applied to the first word-line during the read operation of the first word-line based on at least one of a program state of the data read from memory cells of the second word-line and an operating parameter of the nonvolatile memory device,
wherein each of the memory cells stores at least 3-bit data and is programmed to have one of an erase state and first through seventh program states,
wherein the first through seventh program states have first through seventh threshold voltages increasingly greater, respectively, and
wherein a level of the recover read voltage of the first word-line when the data read from memory cells of the second word-line has the first program state is lower than a level of the recover read voltage of the first word-line when the data read from memory cells of the second word-line has the seventh program state.

2. The method of claim 1, wherein memory cells having the first, third, fifth and seventh program states among the memory cells of the second word-line constitute a group of aggressor cells forcing word-line coupling to memory cells of the first word-line.

3. The method of claim 1, wherein the operation parameter is a retention time corresponding to a time after a program operation performed on the memory cells is completed, and
wherein when data of the memory cells of the first word-line have the first program state, a level of the recover read voltage increases as the retention time of the memory cells of the first word-line increases.

4. The method of claim 1, wherein the operation parameter is an operating temperature of the nonvolatile memory device, and
wherein when data of the memory cells of the first word-line have the first program state, a level of the recover read voltage is increased as the operating temperature increases.

5. The method of claim 1, wherein the data read from the memory cells of the second word-line are used to determine whether the memory cells of the first word-line experience word-line coupling.

6. The method of claim 1, wherein performing the read operation on the first word-line comprises:
reading data from the memory cells of the first word-line by adjusting levels of at least two recover read voltages based on the program states of the data read from the memory cells of the second word-line and the operating parameter.

7. The method of claim 1, further comprising:
performing a read operation on a third word-line adjacent to the first word-line before performing the read operation on the first word-line.

8. The method of claim 7, wherein the read operation on the first word-line is performed further based on data read from memory cells of the third word-line.

9. The method of claim 7, wherein the second word-line is an upper word-line with respect to the first word-line and the third word-line is a lower word-line with respect to the first word-line.

10. A method of reading data in a nonvolatile memory device comprising a plurality of memory cells arranged at intersections of a plurality of word-lines and a plurality of bit-lines, each of the memory cells stored m-bit data and programmed to have one of an erase state and first through $2^m-1$ program states, m being a natural number equal to or greater than 1, the method comprising:
receiving a read request on a first word-line of the plurality of word-lines;
performing a read operation on a second word-line adjacent to the first word-line; and
performing a read operation on the first word-line based on data read from memory cells of the second word-line,
wherein data of the memory cells of the second word-line include one of a first set of program states including a lowermost program state of the first through $2^m-1$ program states and a second set of program states including an uppermost program state of the first through $2^m-1$ program states,
wherein performing the read operation on the first word-line comprises selecting a level of a recover read voltage to apply to the first word-line during the read operation for the first word-line based on the first and second sets of program states of memory cells of the second word-line, and
wherein selecting the level of the recover read voltage to apply to the first word-line comprises:
selecting a first level of the recover read voltage when memory cells of the second word-line have one of the first set of program states; and
selecting a second level greater than the first level of the recover read voltage when memory cells of the second word-line have one of the second set of program states.

11. The method of claim 10, wherein performing the read operation on the first word-line comprises latching a voltage of each sensing node corresponding to each of the bit-lines at least two times while the selected recover read voltage is applied to the first word-line.

12. A method of reading data in a nonvolatile memory device comprising a plurality of memory cells arranged at intersections of a plurality of word-lines and a plurality of bit-lines, each of the memory cells stored m-bit data and programmed to have one of an erase state and first through $2^m-1$ program states, m being a natural number equal to or greater than 1, the method comprising:

receiving a read request on a first word-line of the plurality of word-lines;

performing a read operation on a second word-line adjacent to the first word-line; and performing a read operation on the first word-line based on data read from memory cells of the second word-line, wherein the data of memory cells of the second word-line include one of a first set of program states including a lowermost program state of the first through $2^m-1$ program states and a second set of program states including an uppermost program state of the first through $2^m-1$ program states, and wherein performing the read operation on the first word-line comprises:

selecting a level of a recover read voltage to apply to the first word-line during the read operation for the first word-line based on the first and second sets of program states of memory cells of the second word-line; and latching a voltage of each sensing node corresponding to each of the bit-lines at least two times while the selected recover read voltage is applied to the first word-line.

13. The method of claim 12, wherein latching the voltage of each sensing node comprises:

varying voltages of the sensing nodes according to at least one of the first through $2^m-1$ program states of memory cells of the second word-line and an operating parameter of the nonvolatile memory device during a first time interval;

latching the voltages of the sensing nodes as first data;

pre-charging the sensing nodes;

varying the voltages of the sensing nodes according to at least one of the first through $2^m-1$ program states of memory cells of the second word-line and the operating parameter of the nonvolatile memory device during a second time interval different from the first time interval; and latching the voltages of the sensing nodes as second data.

14. The method of claim 13, wherein the first time interval is smaller than the second time interval.

15. The method of claim 14, wherein each of the first time interval and the second time interval when the data read from the memory cells of the second word-line have one of the first set of program states is smaller than each of the first time interval and the second time interval when the data read from the memory cells of the second word-line have one of the second set of program states.

16. The method of claim 14, wherein the operation parameter of the nonvolatile memory device corresponds to a retention time corresponding to a time after a program operation performed on the memory cells of the second word-line is completed, and wherein when data of the memory cells of the first word-line have one of the first set of program states, each of the first time interval and the second time interval increases as the retention time increases.

\* \* \* \* \*